(12) United States Patent
Jeon et al.

(10) Patent No.: US 12,538,683 B2
(45) Date of Patent: Jan. 27, 2026

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: YoungHo Jeon, Paju-si (KR); Yuseok Jung, Paju-si (KR); Saemleenuri Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/827,579

(22) Filed: Sep. 6, 2024

(65) Prior Publication Data

US 2024/0431152 A1    Dec. 26, 2024

Related U.S. Application Data

(63) Continuation of application No. 17/565,145, filed on Dec. 29, 2021, now Pat. No. 12,114,536.

(51) Int. Cl.
| | |
|---|---|
| *H10K 59/18* | (2023.01) |
| *G09F 9/302* | (2006.01) |
| *H10K 59/122* | (2023.01) |
| *H10K 59/131* | (2023.01) |
| *H10K 59/80* | (2023.01) |

(52) U.S. Cl.
CPC .......... *H10K 59/18* (2023.02); *G09F 9/3026* (2013.01); *H10K 59/122* (2023.02); *H10K 59/131* (2023.02); *H10K 59/8731* (2023.02)

(58) Field of Classification Search
CPC .... H10K 59/18; H10K 59/122; H10K 59/131; H10K 59/8731; H10K 50/844; H10K 59/124; G09F 9/3026; G09F 9/3023; H10D 86/441; H10D 86/60; H10D 86/451; H10H 29/142
See application file for complete search history.

(56) References Cited

U.S. PATENT DOCUMENTS

| | | |
|---|---|---|
| 2017/0323936 A1 | 11/2017 | Lee et al. |
| 2019/0288234 A1 | 9/2019 | Kim et al. |
| 2020/0083306 A1 | 3/2020 | Choi et al. |
| 2020/0161394 A1* | 5/2020 | Jeon ................. H10K 59/8731 |

(Continued)

FOREIGN PATENT DOCUMENTS

| | | |
|---|---|---|
| CN | 110678997 A | 1/2020 |
| EP | 3343273 A2 | 7/2018 |

(Continued)

*Primary Examiner* — Donald L Raleigh
(74) *Attorney, Agent, or Firm* — Seed Intellectual Property Law Group LLP

(57) ABSTRACT

A light emitting display apparatus includes a substrate including a display area, a circuit layer disposed in the display area, a planarization layer disposed over the circuit layer, a dam disposed over the circuit layer along a periphery portion of the substrate, a device isolation portion disposed in the circuit layer and including a device isolation line surrounding the dam, and a light emitting device layer including a self-emitting device disposed over the planarization layer, the dam, and the device isolation portion, the device isolation line may comprise a protrusion tip protruding from the circuit layer to the dam, and the self-emitting device may be isolated by the protrusion tip of the device isolation line at the device isolation portion.

20 Claims, 11 Drawing Sheets

(56) References Cited

U.S. PATENT DOCUMENTS

| | | | |
|---|---|---|---|
| 2021/0202655 A1* | 7/2021 | Cho | H10K 59/131 |
| 2021/0202907 A1 | 7/2021 | Lee et al. | |
| 2024/0130175 A1 | 4/2024 | Shang et al. | |

FOREIGN PATENT DOCUMENTS

| | | |
|---|---|---|
| KR | 10-2016-0093179 A | 8/2016 |
| KR | 10-2017-0054654 A | 5/2017 |
| KR | 10-2018-0002099 A | 1/2018 |
| WO | WO 2020039555 A1 | 2/2020 |

* cited by examiner

LIGHT EMITTING DISPLAY APPARATUS AND MULTI-SCREEN DISPLAY APPARATUS INCLUDING THE SAME

CROSS-REFERENCE TO RELATED APPLICATIONS

This application is a continuation of U.S. patent application Ser. No. 17/565,145, filed Dec. 29, 2021; which claims the benefit of Korean Patent Application No. 10-2020-0189780 filed on Dec. 31, 2020, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation light emitting display apparatuses.

Light emitting display apparatuses display an image based on the light emission of a light emitting device layer including a light emitting device interposed between two electrodes. In this case, light emitted by the light emitting device is discharged to the outside through an electrode and a substrate.

Light emitting display apparatuses include a display panel implemented to display an image. The display panel may include a display area including a plurality of pixels for displaying an image, and a bezel area surrounding the display area.

A light emitting display apparatus of the related art needs a bezel or a mechanism for covering a bezel area disposed at a border (or a periphery portion) of a display panel. Further, the light emitting display apparatus of the related art has a large bezel width (or a large width of the bezel) due to the presence of the bezel. Also, when the bezel width of the light emitting display apparatus is reduced below a certain limit, a light emitting device may be degraded by penetration of external, foreign materials such as water or moisture, and due to this, the reliability of the display panel may be reduced.

Recently, multi-screen light emitting display apparatuses have been commercialized where a large screen is implemented by arranging the light emitting display apparatuses as a lattice type or a matrix type.

BRIEF SUMMARY

The inventors of the present disclosure have appreciated that in a multi-screen light emitting display apparatus of the related art, a boundary portion such as a seam is formed between adjacent light emitting display apparatuses due to a bezel area or a bezel of each of a plurality of light emitting display apparatuses. The boundary portion may cause a sense of disconnected (or discontinuity) of an image when one image is being displayed on a total screen of the multi-screen light emitting display apparatus, and due to this, the immersion of a viewer watching the image may be reduced. Accordingly, the present disclosure is directed to providing a light emitting display apparatus and a multi-screen display apparatus including the same that substantially obviate one or more problems due to limitations and disadvantages of the related art including the above problem identified by the inventors.

An aspect of the present disclosure is directed to providing a light emitting display apparatus and a multi-screen display apparatus including the same, which prevent a reduction in reliability of a light emitting display panel caused by the penetration of water and have a zero bezel width.

Additional advantages and features of the disclosure will be set forth in part in the description which follows and in part will become apparent to those having ordinary skill in the art upon examination of the following or may be learned from practice of the disclosure.

The technical advantages of the disclosure may be realized and attained by the structure particularly pointed out in the written description and claims hereof as well as the appended drawings.

To achieve these and other advantages, as embodied and broadly described herein, a light emitting display apparatus includes a substrate including a display area, a circuit layer disposed in the display area, a planarization layer disposed over the circuit layer, a dam disposed over the circuit layer along a periphery portion of the substrate, a device isolation portion disposed in the circuit layer and including a device isolation line surrounding the dam, and a light emitting device layer including a self-emitting device disposed over the planarization layer, the dam, and the device isolation portion, the device isolation line may comprise a protrusion tip protruding from the circuit layer to the dam, and the self-emitting device may be isolated by the protrusion tip of the device isolation line at the device isolation portion.

In another aspect of the present disclosure, a multi-screen display apparatus comprises a plurality of display devices disposed along at least one direction of a first direction and a second direction transverse to the first direction, each of the plurality of display devices comprises a light emitting display apparatus, and the light emitting display apparatus includes a substrate including a display area, a circuit layer disposed in the display area, a planarization layer disposed over the circuit layer, a dam disposed over the circuit layer along a periphery portion of the substrate, a device isolation portion disposed in the circuit layer and including a device isolation line surrounding the dam, and a light emitting device layer including a self-emitting device disposed over the planarization layer, the dam, and the device isolation portion, the device isolation line may comprise a protrusion tip protruding from the circuit layer to the dam, and the self-emitting device may be isolated by the protrusion tip of the device isolation line at the device isolation portion.

Details of other embodiments will be included in the detailed description of the disclosure and the accompanying drawings.

An embodiment of the present disclosure may provide a light emitting display apparatus and a multi-screen display apparatus including the same, which prevent a reduction in reliability caused by the penetration of water and have a thin bezel width.

An embodiment of the present disclosure may provide a light emitting display apparatus and a multi-screen display apparatus including the same, which prevent a reduction in reliability caused by the penetration of water and have an air bezel or have no bezel.

An embodiment of the present disclosure may provide a multi-screen display apparatus for displaying an image without a sense of discontinuity.

It is to be understood that both the foregoing general description and the following detailed description of the present disclosure are examples and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
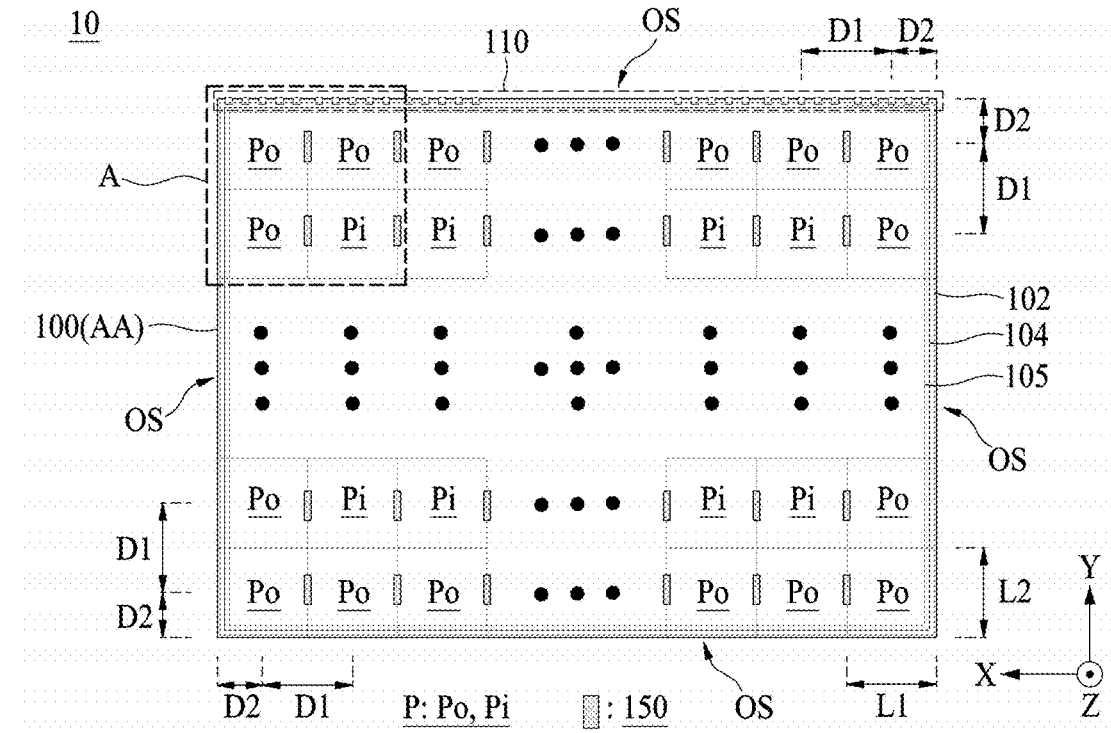
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct (ly)" is used.

In describing a time relationship, for example, when the temporal order is described as, for example, "after," "subsequent," "next," and "before," a case which is not continuous may be included unless a more limiting term, such as "just," "immediate (ly)," or "direct (ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam, this may be construed as the encapsulation layer at least partially surrounding the dam. However, in some embodiments, the encapsulation layer may entirely surround the dam. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, embodiments of the present disclosure are not limited to a scale illustrated in the drawings.

FIG. 1 is a plan view illustrating a light emitting display apparatus according to an embodiment of the present disclosure.

Referring to FIG. 1, the light emitting display apparatus (or a display panel) 10 according to an embodiment of the present disclosure may include a substrate 100 including a display area AA, a plurality of pixels P in the display area AA of the substrate 100, a dam 104, and a device isolation portion 102.

The substrate 100 may be referred to as a first substrate, a base substrate, or a pixel array substrate. The substrate 100 may be a glass substrate, or may be a thin glass substrate or a plastic substrate, which is bendable or flexible.

The display area AA of the substrate 100 may be an area which displays an image and may be referred to as an active portion, an active area, a display portion, or a display portion. A size of the display area AA may be the same as or substantially the same as the substrate 100 (or the light emitting display apparatus or the display panel). For example, a size of the display area AA may be the same as a total size of the first surface of the substrate 100. Therefore, the display area AA may be implemented (or disposed) on the whole front surface of the substrate 100, and thus, the substrate 100 may not include an opaque non-display portion which is provided along a periphery portion (or an edge portion) of the first surface to surround all of the display area AA. Accordingly, a whole front surface of the light emitting display apparatus may implement the display area AA.

An end portion (or an outermost portion) of the display area AA may overlap or may be substantially aligned with the outer surface OS of the substrate 100. For example, with respect to a thickness direction Z of the light emitting display apparatus, a lateral surface (or an end line) of the display area AA may be substantially aligned at a vertical extension line VL (see FIG. 8) vertically extending from the outer surface OS of the substrate 100. The lateral surface of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the substrate 100 corresponding to the end portion of the display area AA may be surrounded by only air (or abutting ambient air), and thus, the light emitting display apparatus according to an embodiment of the present disclosure may have an air-bezel structure or a non-bezel structure (or a zeroized bezel or no bezel) where the end portion (or lateral surface) of the display area AA is surrounded by air. There is not an opaque non-display area at the outermost edge of the substrate; the display area extends complete to the substrate edge.

The plurality of pixels P may be arranged (or disposed) at the display area AA of the substrate 100 to have the first interval D1 along a first direction X and a second direction Y. For example, the first direction X may traverse (or overlap or cross) to the second direction Y. The first direction X may be a widthwise direction, a horizontal direction, or a first length direction (for example, a widthwise length direction) of the substrate 100 or the light emitting display apparatus. The second direction Y may be a lengthwise direction, a vertical direction, or a second length direction (for example, a lengthwise length direction) of the substrate 100 or the light emitting display apparatus.

Each of the plurality of pixels P may be implemented on a plurality of pixel areas defined on the display area AA of the substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size.

Two pixels P adjacent to each other along each of the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment may be include a circuit layer including a pixel circuit implemented in the pixel area on the substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a self-emitting device that emits light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the substrate 100 among the plurality of pixels P. Each of the pixels Po is therefore considered an outermost pixel since within their respective row and/or column of pixels, they are the outmost of the pixels.

A second interval D2 between a center portion of each of the outermost pixels Po and the outer surface OS of the substrate 100 may be half or less of the first interval D1. For example, the second interval D2 may be a distance (or a length) between a center portion of the outermost pixel area PAo (see FIG. 3) and the outer surface OS of the substrate 100. For example, the second interval D2 may be a shortest distance (or a shortest length) between a center portion of the outermost pixel area PAo and the outer surface OS of the substrate 100.

When the second interval D2 is greater than half of the first interval D1, the substrate 100 may have a greater size than the display area AA by a difference area between half of the first interval D1 and the second interval D2, and thus, an area between the end of the outermost pixel Po and the outer surface OS of the substrate 100 may be configured as a non-display area surrounding all of the display area AA. For example, when the second interval D2 is greater than half of the first interval D1, the substrate 100 may include a bezel area based on a non-display area surrounding all of the display area AA. On the other hand, when the second interval D2 is half or less of the first interval D1, the end of each of the outermost pixels Po may be aligned with (or disposed on) the outer surface OS of the substrate 100, or the end portion of the display area AA may be aligned with (or disposed on) the outer surface OS of the substrate 100, and thus, the display area AA may be implemented (or disposed) on the whole front surface of the substrate 100.

The internal pixels Pi may be pixels other than the outermost pixels Po among the plurality of pixels P, or may be pixels surrounding by the outermost pixels Po among the plurality of pixels P. The internal pixels (or second pixels) Pi may be implemented to have a configuration or a structure, which differs from the outermost pixels (or first pixels) Po.

The dam 104 may be implemented at a periphery portion of the substrate 100, or may be implemented at a periphery portion of each of outermost pixels Po disposed in the display area AA, or may be disposed over a circuit layer along a periphery portion of the substrate 100. For example, the dam 104 may be disposed to have a closed loop line shape (or a closed loop shape) between a center portion of each of the outermost pixels Po and an outer surface OS of the substrate 100. Therefore, the outermost pixel Po may include the dam 104, and thus, may be implemented in a structure or a configuration which differs from an inner pixel Pi including no dam 104.

The dam 104 according to an embodiment may prevent the spread or overflow of an organic encapsulation layer of an encapsulation layer disposed over a light emitting device layer at the periphery portion of each of the outermost pixels Po. Also, the dam 104 may isolate (or disconnect) at least some layers of the light emitting device layer at the periphery portion of each of the outermost pixels Po, thereby preventing or minimizing a reduction in reliability of the light emitting device layer caused by the lateral penetration of water (or moisture). The dam 104 may include a function of physically isolating at least some layers of the light emitting device layer at a periphery portion of the substrate 100 or the periphery portion of each of the outermost pixels Po, a function of preventing the spread or overflow of the organic encapsulation layer, and a function of preventing the penetration of water (or moisture) in a lateral direction of the substrate 100.

The device isolation portion 102 may be disposed at the periphery portion of the substrate 100 or the periphery portion of each of the outermost pixels Po to have a closed loop line shape surrounding the dam 104. For example, the device isolation portion 102 may be disposed in a closed loop line shape between an outer surface OS of the substrate 100 and the dam 104. Accordingly, the outermost pixel Po may include the dam 104 and the device isolation portion 102, and thus, may be implemented in a structure or a configuration which differs from an inner pixel Pi including no dam 104 and device isolation portion 102.

The device isolation portion 102 according to an embodiment may be implemented to include a protrusion tip structure which protrudes from a circuit layer toward the dam 104. The device isolation portion 102 may isolate (or disconnect) at least some layers of the light emitting device layer in an outer region of the dam 104, and thus, may primarily block a lateral water penetration path, thereby preventing or minimizing a reduction in reliability of the light emitting device layer caused by the lateral penetration of water (or moisture). For example, at least some layers of the light emitting device layer disposed on the device isolation portion 102 may be additionally isolated by the protrusion tip structure of the device isolation portion 102.

The light emitting display apparatus (or a display panel) 10 according to an embodiment of the present disclosure may further include a groove line 105.

The groove line 105 may be disposed to be surrounded by the dam 104. For example, the groove line 105 may be disposed in a groove region (or a ditch region) defined at an inner region of the dam 104.

The groove line 105 according to an embodiment may be disposed to have a closed loop line shape between a lateral surface of the planarization layer 103a (see FIG. 8) nd the dam 104. For example, the groove line 105 may be formed or implemented by removing all elements such as a structure material and/or a stepped portion disposed at the groove region of the inner region of the dam 104. For example, the groove line 105 may be implemented to expose the circuit layer disposed between the lateral surface of the planarization layer 103 and the dam 104. Also, the groove line 105 may be implemented to isolate at least some layers of the light emitting device layer disposed at the inner region of the dam 104.

The light emitting display apparatus (or a display panel) 10 according to an embodiment of the present disclosure may further include a pad part 110.

The pad part 110 may be a first pad part or a front pad part. The pad part 110 may include a plurality of pads to receive a data signal, a gate control signal, a pixel driving power, a reference voltage, and a pixel common voltage, or the like from the driving circuit part.

The pad part 110 may be included within the outmost pixels Po disposed at a first periphery portion of the first surface of the substrate 100 parallel to the first direction X. That is, the outermost pixels Po disposed at the first periphery portion of the substrate 100 may include at least one of the plurality of pads. Therefore, the plurality of pads may be disposed or included within the display area AA, and thus, a non-display area (or a bezel area) based on the pad part 110 may not be formed or may not be on the substrate 100. Therefore, the outermost pixel (or first pixels) Po may include the pad part 110, and thus, may be implemented to have a configuration or a structure, which differs from the internal pixel (or second pixels) Pi including no the pad part 110.

For example, when the pad part 110 is not provided within the outermost pixels Po and is disposed between the outermost pixels Po and the outer surface OS of the substrate 100, the substrate 100 may include a non-display area (or a non-display portion) corresponding to an area where the pad part 110 is provided, and due to the non-display area, the second interval D2 between the outermost pixels Po and the outer surface OS of the substrate 100 may be greater than half of the first interval D1, all of the substrate 100 may not be implemented as the display area AA, and a separate bezel (or a separate structure) for covering the non-display area may be needed. On the other hand, the pad part 110 according to an embodiment of the present disclosure may be disposed between the outermost pixels Po and the outer surface OS of the substrate 100 to be included within the outermost pixels Po, and thus, a non-display area (or a bezel area) based on the pad part 110 may not be formed or may not be between the outermost pixels Po and the outer surface OS of the substrate 100.

The light emitting display apparatus (or a display panel) 10 according to an embodiment of the present disclosure may further include a gate driving circuit 150.

The gate driving circuit 150 may be disposed in the display area AA to supply a scan signal (or a gate signal) to the pixels P disposed on the substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line GL (see FIG. 3).

The gate driving circuit 150 according to an embodiment may be implemented with a shift register including a plurality of stage circuit units. That is, the light emitting display apparatus according to an embodiment of the present disclosure may include a shift register which is disposed in the display area AA of the substrate 100 to supply the scan signal to the pixel P.

Each of the plurality of stage circuit units may include a plurality of branch circuits which are arranged spaced apart from one another in each horizontal line of the substrate 100 in a first direction X. Each of the plurality of branch circuits may include at least one thin film transistor (TFT) (or branch TFT) and may be disposed between two adjacent pixels of one or more pixels P (or a pixel area) in one horizontal line in the first direction X. Each of the plurality of stage circuit units may generate a scan signal through driving of the plurality of branch circuits based on a gate control signal supplied through gate control lines disposed spaced apart from one another between a plurality of pixels P in the display area AA and may supply the scan signal to pixels P arranged in a corresponding horizontal line.

Figure 2A:
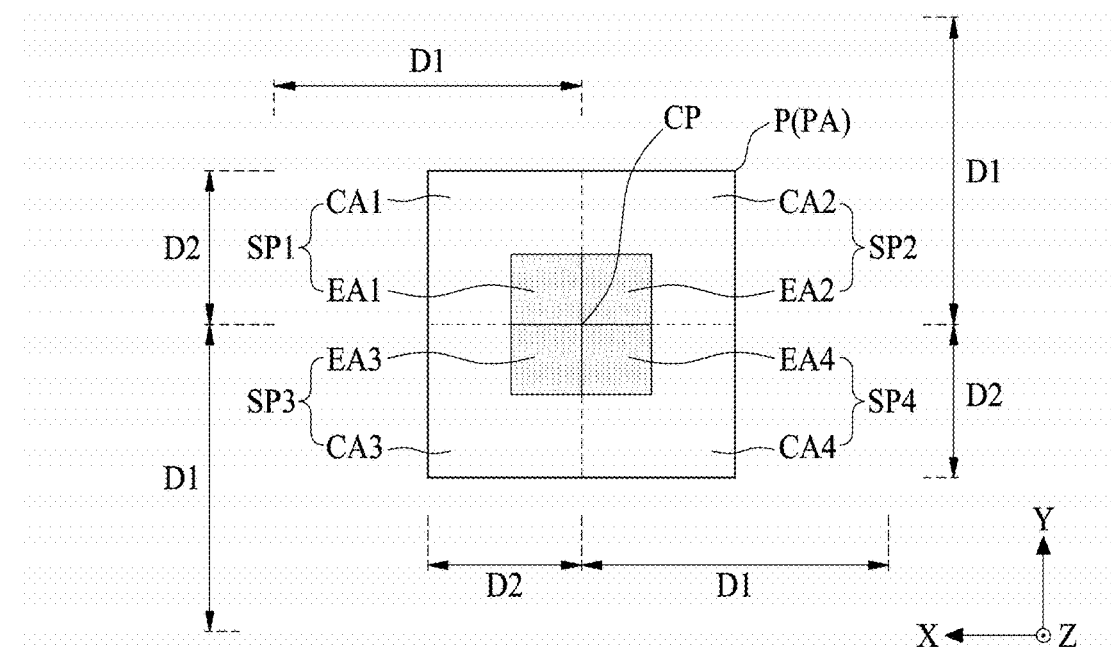
FIG. 2A is a diagram illustrating one pixel according to an embodiment of the present disclosure illustrated in FIG. 1.
Figure 2B:
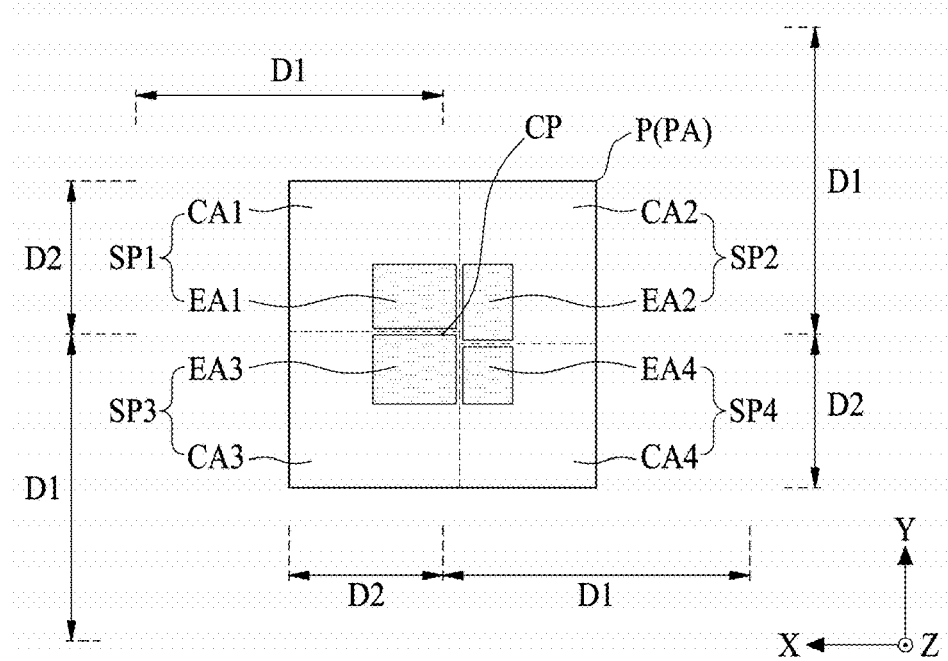
FIG. 2B is a diagram illustrating one pixel according to another embodiment of the present disclosure illustrated in FIG. 1.
Figure 2C:
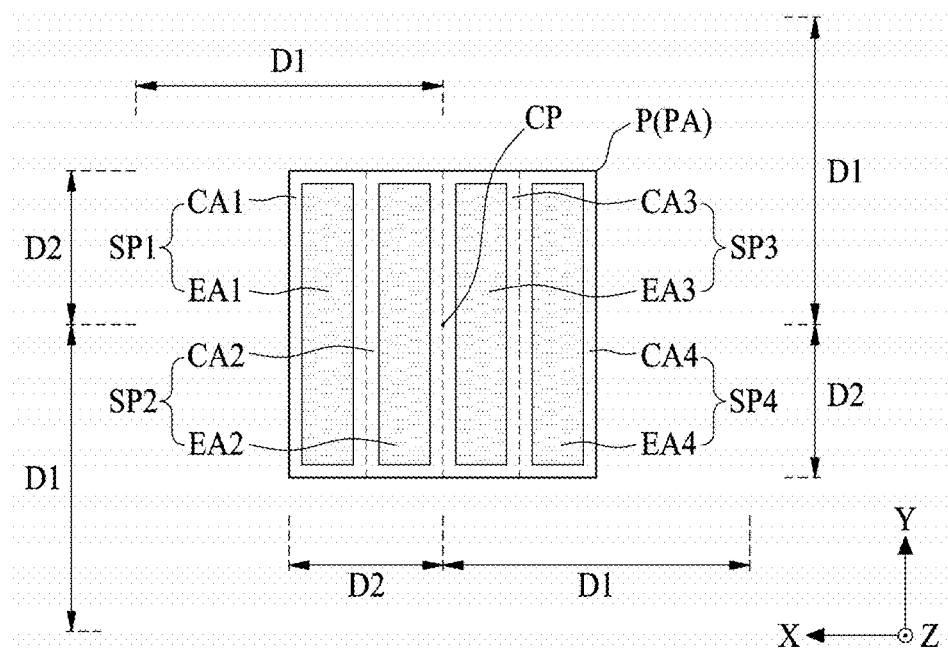
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). The size can be considered in one embodiment an area that is defined in terms of the length and the width of a structure, such as the display area or the substrate. According to an embodiment, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment, when the emission areas EA1 to EA4 have a non-uniform quad structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment, each of the emission areas EA1 to EA4 having the uniform stripe structure may be disposed at center portion CP of the corresponding subpixel area to have a size which is less than each of four equal division regions of the pixel P.

According to another embodiment, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment, when the emission areas EA1 to EA4 have a non-uniform stripe structure, among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for emitting a corresponding subpixel of the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas of the circuit areas CA1 to CA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
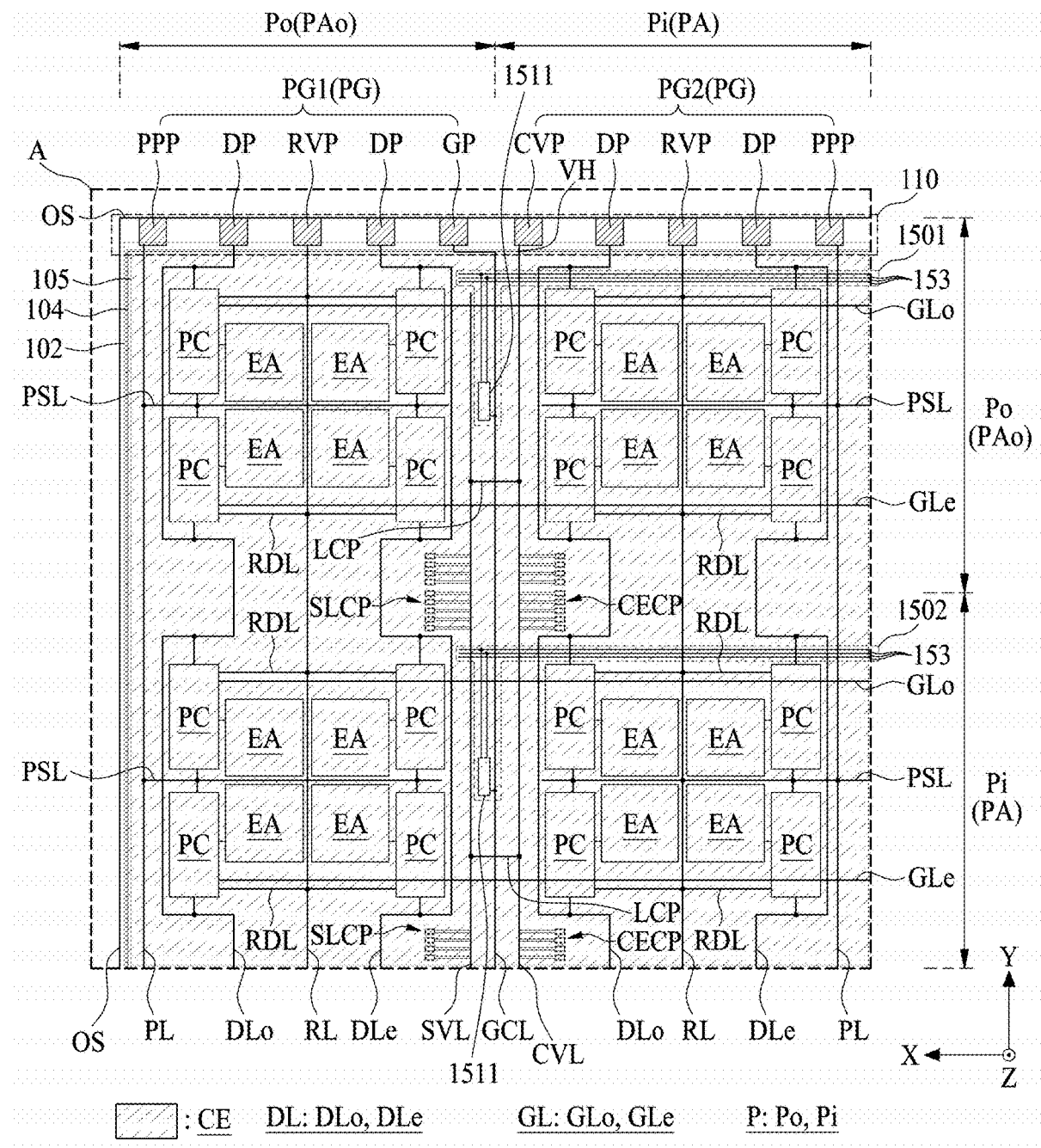
FIG. 3 is an enlarged view of a region 'A' illustrated in FIG. 1.
Figure 4:
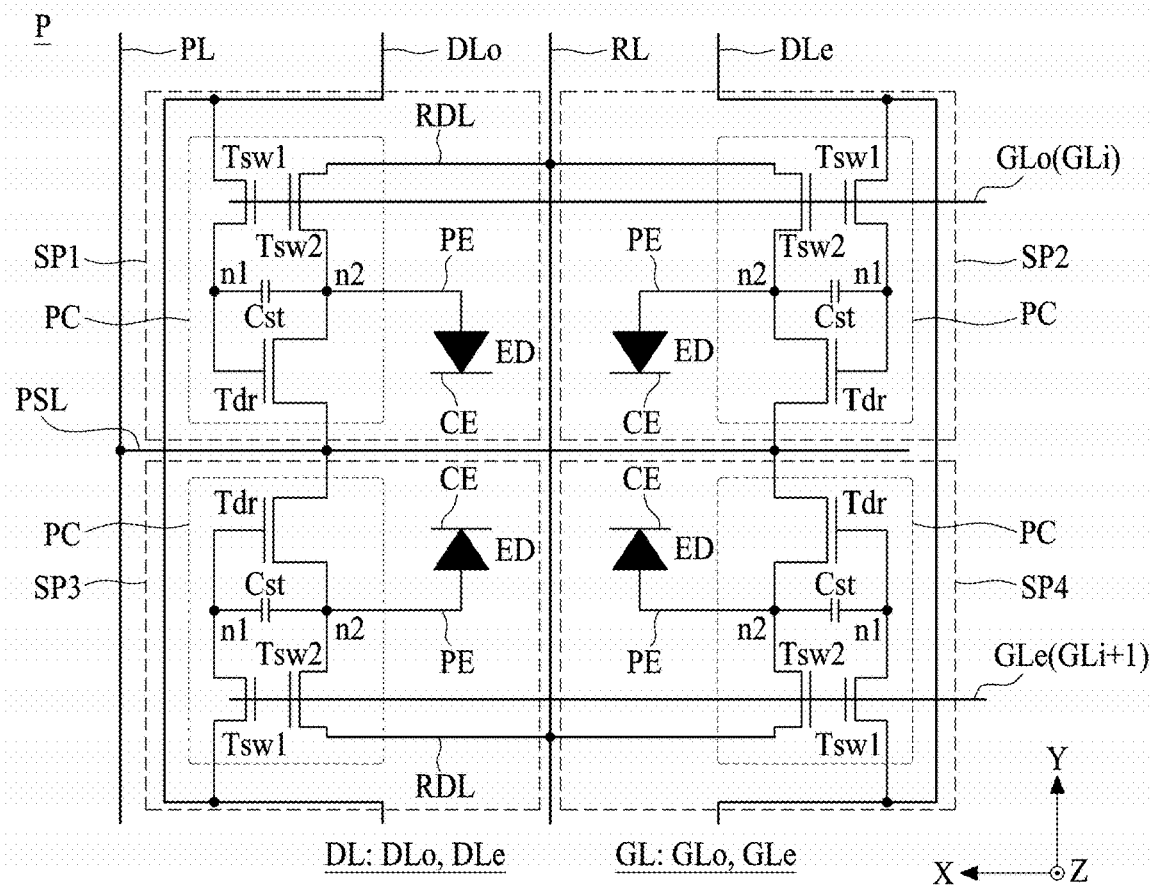
FIG. 4 is an equivalent circuit diagram illustrating one subpixel illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a substrate 100 according to an embodiment of the present disclosure may include pixel driving lines DL, GL, PL, CVL, RL, and GCL, a plurality of pixels P, a common electrode CE, a plurality of common electrode connection portions CECP, a dam 104, a device isolation portion 102, a groove line 105, and a pad part 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

The plurality of data lines DL may extend long in a second direction Y and may be disposed spaced apart from one another by a predetermined interval in a display area AA of the substrate 100 along the first direction X. For example, in the plurality of data lines DL, an odd-numbered data line DLo may be disposed at a first periphery portion of each of a plurality of pixel areas PA arranged at the substrate 100 along the second direction Y, and an even-numbered data line DLe may be disposed at a second periphery portion of each of the plurality of pixel areas PA arranged at the substrate 100 along the second direction Y, but embodiments of the present disclosure are not limited thereto.

The plurality of gate lines GL may extend long in the first direction X and may be disposed spaced apart from one another by a predetermined interval in the display area AA of the substrate 100 along the second direction Y. For example, an odd-numbered gate line GLo of the plurality of gate lines GL may be disposed at a third periphery portion of each of the plurality of pixel areas PA arranged on the substrate 100 along the first direction X. An even-numbered gate line GLe of the plurality of gate lines GL may be disposed at a fourth periphery portion of each of the plurality of pixel areas PA arranged at the substrate 100 along the first direction X, but embodiments of the present disclosure are not limited thereto.

The plurality of pixel driving power lines PL may extend long in the second direction Y and may be disposed spaced apart from one another by a predetermined interval in the display area AA of the substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the light emitting display apparatus according to an embodiment of the present disclosure may prevent or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed spaced apart from one another by a predetermined interval in the display area AA of the substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed spaced apart from one another by a predetermined interval in the display area AA of the substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. Accordingly, in some embodiments, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

Each of the plurality of gate control lines GCL may extend long in the second direction Y and may be disposed spaced apart from one another by a predetermined interval in the display area AA of the substrate 100 in the first direction X. For example, each of the plurality of gate control lines GCL may be disposed between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first electrode (source/drain) coupled to a corresponding data line DL (DLo or DLe), and a second electrode (source/drain) coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first electrode (source/drain) coupled to a source node n2 of the driving TFT Tdr, and a second electrode (source/drain) coupled to a corresponding reference voltage line RL. The second switching TFT Tsw2 may be turned on by a scan signal supplied through the corresponding gate line GL (GLo or GLe) and may transfer a reference voltage, supplied through the corresponding reference voltage line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second electrode (source/drain) of the first switching TFT Tsw1 and the first capacitor electrode of the storage capacitor Cst in common, a first electrode (source/drain) (or the source node n2) coupled to the first electrode (source/drain) of the second switching TFT Tsw2, the second capacitor electrode of the storage capacitor Cst, and a pixel electrode PE of the light emitting device layer in common, and a second electrode (source/drain) (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The light emitting device layer may be disposed in an emission area EA of the pixel area PA and electrically coupled to the pixel circuit PC. The light emitting device layer according to an embodiment of the present disclosure may include a pixel electrode PE electrically coupled to the pixel circuit PC, a common electrode CE electrically coupled to the pixel common voltage line CVL, and a self-emitting device ED interposed between the pixel electrode PE and the common electrode CE.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to the second direction Y, each of the plurality of common electrode connection portions CECP according to an embodiment of the present disclosure may be electrically coupled to each of the plurality of pixel common voltage lines CVL at a portion between the plurality of the pixels P (or at the boundary between a plurality of pixels P) and may be electrically coupled to a portion of the common electrode CE, and thus, may electrically couple the common electrode CE to each of the plurality of pixel common voltage lines CVL. For example, the common electrode CE may be coupled to each of the plurality of common electrode connection portions CECP by a side contact structure corresponding to an undercut structure.

Each of the plurality of common electrode connection portions CECP may be disposed a portion between the plurality of the pixels P to electrically couple the common electrode CE to each of the plurality of pixel common voltage lines CVL, and thus, may prevent or minimize the voltage drop (IR drop) of the pixel common voltage caused by a surface resistance of the common electrode CE. Accordingly, the light emitting display apparatus according to an embodiment of the present disclosure may prevent or minimize the degradation in image quality caused by a deviation of the pixel common voltage supplied to each of the pixels P arranged in the display area AA.

According to an embodiment, each of the plurality of common electrode connection portions CECP may be formed together with a pixel electrode PE having at least two-layer structure so as to be electrically coupled to each of the plurality of pixel common voltage lines CVL. Each of the plurality of common electrode connection portions CECP may be coupled to the common electrode CE through a side contact structure having a ")"-shaped cross-sectional structure or a "("-shaped cross-sectional structure. For example, when each of the plurality of common electrode connection portions CECP is formed of first and second metal layers, each of the plurality of common electrode connection portions CECP may include a side contact structure corresponding to an undercut structure or a tapered structure formed on the lateral surface of the first metal layer by an etching speed difference between the first metal layer and the second metal layer. For example, when each of the plurality of common electrode connection portions CECP is formed of first to third metal layers, each of the plurality of common electrode connection portions CECP may include a side contact structure corresponding to an undercut structure or a tapered structure formed at the lateral surface of the first metal layer and/or the second metal layer by an etching speed difference between the first and second metal layers.

Each of the dam 104, the device isolation portion 102, and the groove line 105 may be disposed or implemented at a periphery portion of the outermost pixel Po or the substrate 100 to have a closed loop line shape (or a closed loop shape). This is as described with reference to FIG. 1, and thus, their repetitive descriptions are omitted.

The pad part 110 may be disposed at a first periphery portion of the first surface of the substrate 100 parallel to the first direction X. The pad part 110 may be disposed at a third periphery portion of each of outermost pixel areas PAo disposed at the first periphery portion of the substrate 100. With respect to the second direction Y, an end portion of the pad part 110 may overlap or may be aligned with an end portion of each of the outermost pixel areas PAo. Therefore, the pad part 110 may be included (or disposed) in each of the outermost pixel areas PAo disposed at the first periphery portion of the substrate 100, and thus, a non-display area (or a bezel area) based on the pad part 110 may not be formed or may not be in the substrate 100.

The pad part 110 may include a plurality of first pads which are disposed in parallel with one another along the first direction X at the first periphery portion of the substrate 100. The plurality of first pads may be divided (or classified) into a first data pads DP, a first gate pads GP, a first pixel driving power pads PPP, a first reference voltage pads RVP, and a first pixel common voltage pads CVP.

Each of the first data pads DP may be individually (or a one-to-one relationship) coupled to one side end of each of the plurality of data lines DLo and DLe disposed at the substrate 100.

In the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1 (PG) indicates that PG1, the first pad group, is a specific item within the broad pad group, PG. Similarly, in FIG. 5, the notation 150m (150) indicates that each of the circuits 1501, 1502, . . . 1511, 1512 etc. is driving circuit within the broad group of driving circuits 150. In addition, the notation 111 (110) in FIGS. 13A-13D indicates that item 111 is one specific first pad within the group of first pads 110. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively.

Each of the first gate pads GP may be individually (or a one-to-one relationship) coupled to one side end of each of the gate control lines GCL disposed at the first substrate 100. The first gate pads GP according to an embodiment may be divided (or classified) into a first start signal pad, a plurality of first shift clock pads, a plurality of first carry clock pads, at least one first gate driving power pad, and at least one first gate common power pad.

Each of the first pixel driving power pads PPP may be individually (or a one-to-one relationship) coupled to one side end of each of the plurality of pixel driving power lines PL disposed at the substrate 100. Each of the first reference voltage pads RVP may be individually (or a one-to-one relationship) coupled to one side end of each of the plurality of reference voltage lines RL disposed at the substrate 100. Each of the first pixel common voltage pads CVP may be individually (or a one-to-one relationship) coupled to one side end of each of the plurality of pixel common voltage lines CVL disposed at the substrate 100.

The pad part 110 according to an embodiment may include a plurality of pad groups PG which are arranged in the order of a first pixel driving power pad PPP, a first data pad DP, a first reference voltage pad RVP, a first data pad DP, a first gate pad GP, a first pixel common voltage pad CVP, a first data pad DP, a first reference voltage pad RVP, a first data pad DP, and a first pixel driving power pad PPP along the first direction X. Each of the plurality of pad groups PG may be coupled to two adjacent pixels P disposed along the first direction X. For example, the plurality of pad groups PG may include a first pad group PG1 including a first pixel driving power pad PPP, a first data pad DP, a first reference voltage pad RVP, a first data pad DP, and a first gate pad GP continuously disposed in an odd-numbered pixel area PA along the first direction X, and a second pad group PG2 including a first pixel common voltage pad CVP, a first data pad DP, a first reference voltage pad RVP, a first data pad DP, and a first pixel driving power pad PPP continuously disposed in an even-numbered pixel area PA along the first direction X.

The substrate 100 according to an embodiment may further include a plurality of secondary voltage lines SVL and a plurality of secondary line connection portions SLCP. For example, the secondary voltage lines may be referred to as an additional voltage lines or an auxiliary voltage lines, or the like.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically coupled to an adjacent pixel common voltage line CVL without being electrically coupled to the pixel common voltage pad CVP and may be supplied with a pixel common voltage through the adjacent pixel common voltage line CVL. Accordingly, in some embodiments, the substrate 100 according to an embodiment of the present disclosure may further include a plurality of line connection patterns LCP which electrically couple a pixel common voltage line CVL and a secondary voltage lines SVL adjacent to each other.

Each of the plurality of line connection patterns LCP may be disposed at the substrate 100 so that the line connection pattern LCP and a pixel common voltage line CVL and a secondary voltage lines SVL adjacent to each other overlap with each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed at an insulation layer over the secondary voltage lines SVL, and the other side of each of the plurality of line connection patterns LCP may be electrically coupled to a portion of the pixel common voltage line CVL through a second line contact hole formed at the insulation layer over the pixel common voltage line CVL.

Each of the plurality of secondary line connection portions SLCP may electrically couple the common electrode CE to each of the plurality of secondary voltage lines SVL between the plurality of pixels P overlapping each of the plurality of secondary voltage lines SVL. With respect to the second direction Y, each of the plurality of secondary line connection portions SLCP according to an embodiment may be electrically coupled to each of the plurality of secondary voltage lines SVL at a portion between the plurality of pixels P or a boundary region between the plurality of pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the light emitting display apparatus according to an embodiment of the present disclosure may prevent or minimize the degradation in image quality caused by a deviation of the pixel common voltage supplied to each of the pixels P arranged in the display area AA. Also, in the light emitting display apparatus according to an embodiment of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

The substrate 100 according to an embodiment of the present disclosure may further include an encapsulation layer.

The encapsulation layer may be implemented to surround the light emitting device layer. The encapsulation layer according to an embodiment may include a first inorganic encapsulation layer (or a first encapsulation layer) disposed over the light emitting device layer, the dam 104, and the device isolation portion 105, a second inorganic encapsulation layer (or a third encapsulation layer) disposed over the first inorganic encapsulation layer, and an organic encapsulation layer (or a second encapsulation layer) interposed between the first inorganic encapsulation layer and the second inorganic encapsulation layer disposed over an encapsulation area defined by the dam 104.

The organic encapsulation layer may cover a top surface (or an upper surface) of the light emitting device layer and flow toward the end portion of the substrate 100, and the spread (or flow) of the organic encapsulation layer may be blocked by the dam 104. The dam 104 may define or limit a disposition region (or an encapsulation region) of the organic encapsulation layer, moreover, and may block or prevent the spread or overflow of the organic encapsulation layer.

Figure 5:
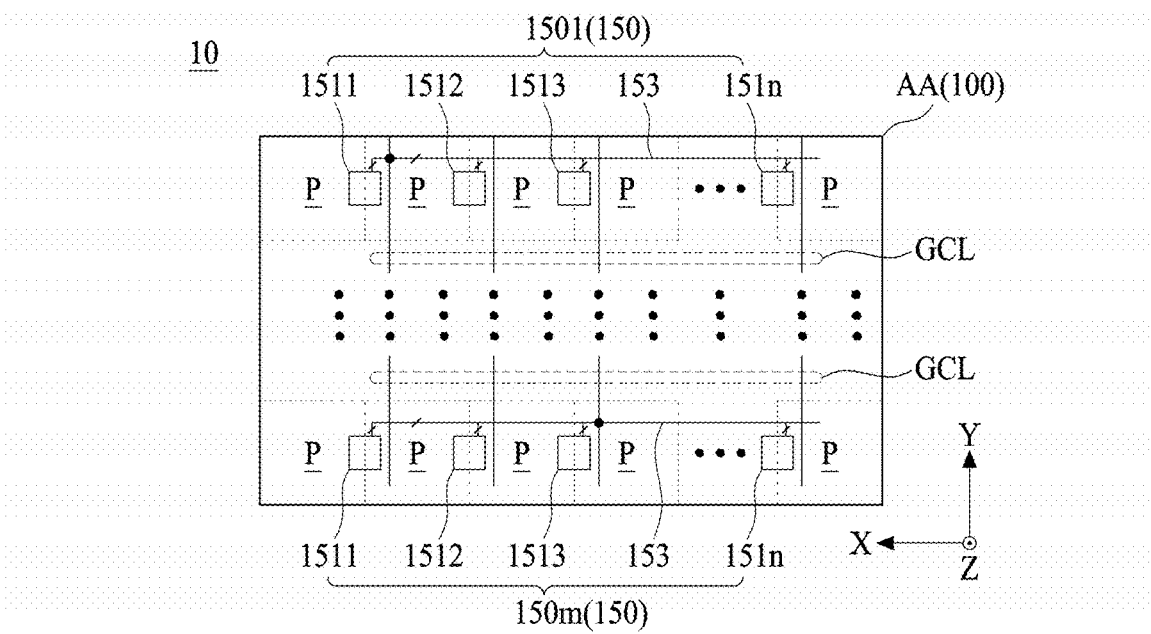
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, the gate driving circuit 150 according to another embodiment of the present disclosure may be implemented (or embedded) within the display area AA of the substrate 100. The gate driving circuit 150 may generate a scan signal based on gate control signals supplied through the pad part 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined interval in a display area AA of the substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150*m*, where m is an integer of 2 or more.

Each of the plurality of stage circuit portions 1501 to 150*m* may be individually disposed in each horizontal line of a first surface of the substrate 100 along the first direction X and may be dependently coupled to one another along the second direction Y. Each of the plurality of stage circuit portions 1501 to 150*m* may generate a scan signal in a predetermined order in response to gate control signals supplied through the pad part 110 and the gate control lines GCL and may supply the scan signal to a corresponding gate line GL.

Each of the plurality of stage circuit portions 1501 to 150*m* according to an embodiment may include a plurality of branch circuits 1511 to 151*n* and a branch network 153.

The plurality of branch circuits 1511 to 151*n* may be selectively coupled to the gate control lines of the gate control lines GCL through the branch network 153 and may be electrically coupled to one another through the branch network 153. Each of the plurality of branch circuits 1511 to 151*n* may generate the scan signal based on a gate control signal supplied through the gate control lines GCL and a voltage of the branch network 153, and may supply the scan signal to a corresponding gate line GL.

Each of the plurality of branch circuits 1511 to 151*n* may include at least one TFT (or branch TFT) of a plurality of TFTs configuring one stage circuit portion of the stage circuit portions 1501 to 150*m*. Any one branch circuit of the plurality of branch circuits 1511 to 151*n* may include a pull-up TFT coupled to the gate line GL. The other branch circuit of the plurality of branch circuits 1511 to 151*n* may include a pull-down TFT coupled to the gate line GL.

Each of the plurality of branch circuits 1511 to 151*n* according to an embodiment of the present disclosure may be disposed at a circuit area between two adjacent pixels $P_{or}$ at a circuit area between at least two adjacent pixels P, in each horizontal line of the substrate 100, but embodiments of the present disclosure are not limited thereto. For example, each of the plurality of branch circuits 1511 to 151*n* may be disposed at a circuit area (or a boundary region) between at least one or more adjacent pixels P according to the number of TFTs configuring each of the stage circuit portions 1501 to 150*m* and the number of pixels P disposed one horizontal line.

The branch network 153 may be disposed at each horizontal line of the substrate 100 and may electrically couple the plurality of branch circuits 1511 to 151*n* to each other. The branch network 153 according to an embodiment of the present disclosure may include a plurality of control node lines and a plurality of network line.

The plurality of control node lines may be disposed at each horizontal line of the substrate 100 and may be selectively coupled to the plurality of branch circuits 1511 to 151*n* in one horizontal line. For example, the plurality of control node lines may be disposed at an upper edge region (or a lower edge region) among pixel areas arranged at each horizontal line of the substrate 100.

The plurality of network line may be selectively coupled to the gate control lines GCL disposed at the substrate 100 and may be selectively coupled to the plurality of branch circuits 1511 to 151*n*. For example, the plurality of network line may transfer the gate control signal supplied from the gate control lines GCL to corresponding branch circuits 1511 to 151*n* and may transfer a signal between the plurality of branch circuits 1511 to 151*n*.

As described above, according to an embodiment of the present embodiment, because the gate driving circuit 150 is disposed within the display area AA of the substrate 100, a second interval D2 between a center portion of the outermost pixel area PAo and the outer surfaces OS of the substrate 100 may be equal to or less than half of a first interval (or a pixel pitch) D1 between adjacent pixel areas PA. For example, when the gate driving circuit 150 is not disposed in the display area AA of the substrate 100 and is disposed at a periphery portion of the substrate 100, the second interval D2 may not be equal to or less than half of the first interval D1. Accordingly, in the light emitting display apparatus according to an embodiment of the present disclosure, the gate driving circuit 150 may be disposed in the display area AA of the substrate 100, and thus, the second interval D2 may be implemented to be equal to or less than half of the first interval D1, and moreover, the light emitting display apparatus may be implemented to have an air bezel structure which has a zeroized bezel or where a bezel area is not provided.

Figure 6:
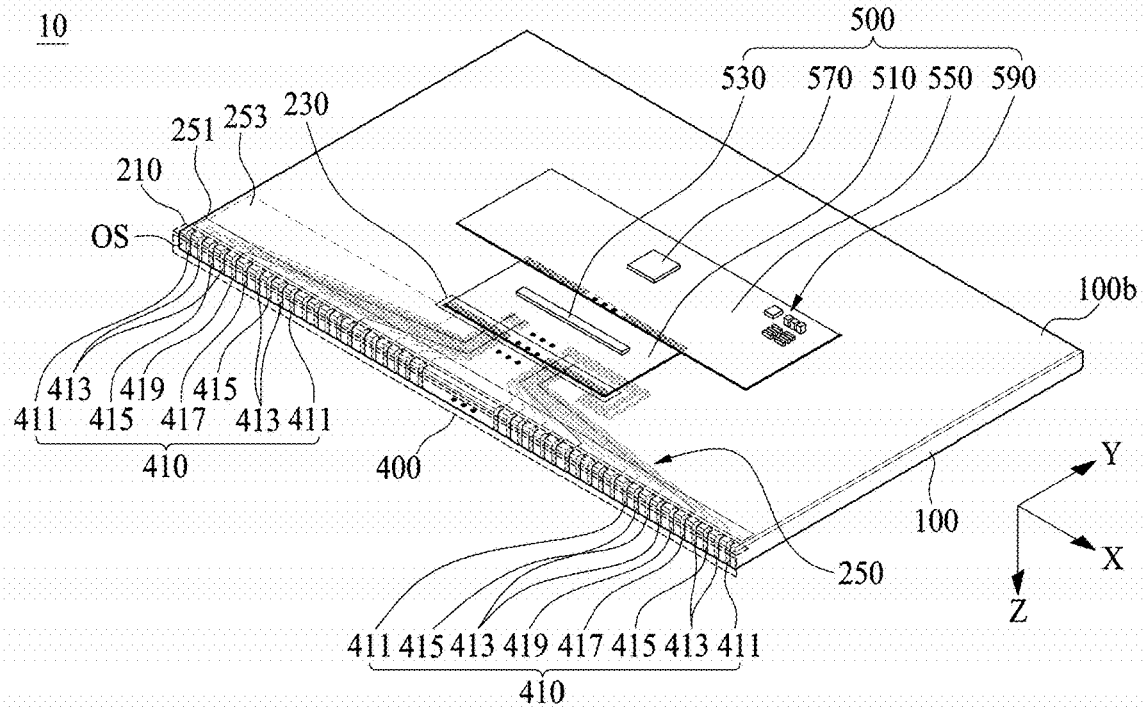
FIG. 6 is a diagram illustrating a rear surface of a light emitting display apparatus according to an embodiment of the present disclosure.

FIG. 6 is a diagram illustrating a rear surface of a light emitting display apparatus according to an embodiment of the present disclosure.

Referring to FIGS. 1, 3, and 6, the light emitting display apparatus according to an embodiment of the present disclosure may further include a second pad portion 210 disposed at a rear surface (a backside surface) 100*b* of the substrate 100.

The second pad portion 210 may be disposed at one periphery portion (or a first rear periphery portion) of a rear surface 100*b* of the substrate 100 overlapping the pad part 110 disposed at a front surface 100*a* of the substrate 100. In the following description of FIG. 6, the pad part 110 which is disposed at a front surface 100*a* of the substrate 100 may be referred to as a first pad part 110.

The second pad part 210 may include a plurality of second pads (or routing pads) which are arranged at a certain interval along the first direction X to respectively overlap the pads of the first pad part 110. In the following description of FIG. 6, a pad of the pad part 110 may be referred to as a first pad.

The plurality of second pads may be divided (or classified) into second pixel driving power pads overlapping each of the first pixel driving power pads PPP of the first pad part 110, second data pads overlapping each of the first data pads DP of the first pad part 110, second reference voltage pads overlapping each of the first reference voltage pads RVP of the first pad part 110, second gate pads overlapping each of the first gate pads GP of the first pad part 110, and second pixel common voltage pads overlapping each of the first pixel common voltage pads CVP of the first pad part 110.

The light emitting display apparatus according to an embodiment of the present disclosure may further include at least one third pad part 230 and a link line part 250 which are disposed over the rear surface 100*b* of the substrate 100.

The at least one third pad part 230 (or an input pad part) may be disposed at the rear surface 100*b* of the substrate 100. For example, the at least one third pad part 230 may be disposed at a middle portion adjacent to the first periphery portion of the rear surface 100b of the substrate 100. The at least one third pad part 230 according to an embodiment of the present disclosure may include a plurality of third pads (or input pads) which are spaced apart from one another by a certain interval. For example, the at least one third pad part 230 may include third pixel driving power pads, third data pads, third reference voltage pads, third gate pads, and third pixel common voltage pads.

The link line part 250 may include a plurality of link lines disposed between the second pad part 210 and the at least one third pad part 230.

The link line part 250 according to an embodiment of the present disclosure may include a plurality of pixel driving power link lines which individually (or a one-to-one relationship) couple the second pixel driving power pads to the third pixel driving power pads, a plurality of data link lines which individually (or a one-to-one relationship) couple the second data pads to the third data pads, a plurality of reference voltage link lines which individually (or a one-to-one relationship) couple the second reference voltage pads to the third reference voltage pads, a plurality of gate link lines which individually (or a one-to-one relationship) couple the second gate pads to the third gate pads, and a plurality of pixel common voltage link lines which individually (or a one-to-one relationship) couple the second pixel common voltage pads to the third pixel common voltage pads.

Each of the plurality of pixel common voltage link lines may include a first common link line 251 and a second common link line 253. The first common link line 251 may be disposed between the second pad part 210 and the at least one third pad part 230 and commonly coupled to the plurality of second pixel common voltage pads. The second common link line 253 may be commonly coupled to the plurality of third pixel common voltage pads and electrically coupled to the first common link line 251. The second common link line 253 may be disposed on a different layer from the first common link line 251 and may be electrically coupled to the first common link line 251 through a via hole. A size of the second common link line 253 may progressively increase in a direction from the third pad part 230 to the periphery portion of the substrate 100 in order to reduce (or minimize) the voltage drop of the pixel common voltage.

The light emitting display apparatus according to an embodiment of the present disclosure may further include a routing portion 400 which is disposed at an outer surface OS of the substrate 100.

The routing portion 400 may be disposed to surround the first pad part 110, the outer surface OS, and the second pad part 210 of the substrate 100.

The routing portion 400 according to an embodiment may include a plurality of routing lines 410. Each of the plurality of routing lines 410 may be disposed at a certain interval along the first direction X, may be formed to surround the first pad part 110, the outer surface OS, and the second pad part 210 of the substrate 100, and may be electrically coupled to each of the first pads of the first pad part 110 and the second pads of the second pad part 210 in one-to-one relationship. According to an embodiment, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

The plurality of routing lines 410 according to an embodiment of the present disclosure may be divided (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be formed to surround the first pad part 110, the outer surface OS, and the second pad part 210, and may be electrically coupled to the plurality of first pixel driving power pads of the first pad part 110 and the plurality of second pixel driving power pads of the second pad part 210 in a one-to-one relationship.

The plurality of data routing lines 413 may be formed to surround the first pad part 110, the outer surface OS, and the second pad part 210, and may be electrically coupled to the plurality of first data pads of the first pad part 110 and the plurality of second data pads of the second pad part 210 in a one-to-one relationship.

The plurality of reference voltage routing lines 415 may be formed to surround the first pad part 110, the outer surface OS, and the second pad part 210, and may be electrically coupled to the plurality of first reference voltage pads of the first pad part 110 and the plurality of second reference voltage pads of the second pad part 210 in a one-to-one relationship.

The plurality of gate routing lines 417 may be formed to surround the first pad part 110, the outer surface OS, and the second pad part 210, and may be electrically coupled to the plurality of first gate pads of the first pad part 110 and the plurality of second gate pads of the second pad part 210 in a one-to-one relationship.

The plurality of pixel common voltage routing lines 419 may be formed to surround the first pad part 110, the outer surface OS, and the second pad part 210, and may be electrically coupled to the plurality of first pixel common voltage pads of the first pad part 110 and the plurality of second pixel common voltage pads of the second pad part 210 in a one-to-one relationship.

The light emitting display apparatus or the routing portion 400 according to an embodiment of present disclosure may further include an edge coating layer.

The edge coating layer 430 (see FIG. 8) may be implemented to cover the routing portion 400. The edge coating layer 430 according to an embodiment may be implemented to cover all of the first periphery portion and the first outer surface OS1a of the substrate 100 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize the reflection of external light caused by the plurality of routing lines 410 and the first pads of the first pad part 110. The edge coating layer 430 according to an embodiment may include a light blocking material including black ink. For example, the edge coating layer 430 may be an edge protection layer or an edge insulating layer.

The light emitting display apparatus according to an embodiment of the present disclosure may further include a driving circuit part 500.

The driving circuit part 500 may drive (or emit light) the pixels P disposed on the substrate 100 based on digital video data and a timing synchronization signal supplied from a display driving system to allow the display area AA to display an image corresponding to image data. The driving circuit part 500 may be coupled to the at least one third pad part 230 disposed at the rear surface 100*b* of the substrate 100 and may output, to the at least one third pad part 230, a data signal, a gate control signal, and a driving power for driving (or emitting light) the pixels P disposed at the substrate 100.

The driving circuit part 500 according to an embodiment may include a flexible circuit film 510, a driving integrated circuit (IC) 530, a printed circuit board (PCB) 550, a timing controller 570, and a power circuit 590.

The flexible circuit film 510 may be coupled to the at least one third pad part 230 disposed at the rear surface 100*b* of the substrate 100.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads in the at least one third pad part 230 through the flexible circuit film 510.

The driving IC 530 may sense a characteristic value of a driving TFT disposed in the subpixel SP through the plurality of reference voltage lines RL (or pixel sensing line) disposed at the substrate 100, generate sensing raw data corresponding to a sensing value for each subpixel, and provide the sensing raw data for each subpixel to the timing controller 570.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board coupled between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment may include a start signal (or a gate start pulse), a plurality of shift clocks, a forward driving signal, and a reverse driving signal. In this case, the plurality of shift clocks may include a plurality of scan clocks where phases thereof are sequentially shifted and a plurality of carry clocks where phases thereof are sequentially shifted. Additionally, the gate control signal according to an embodiment may further include an external sensing line selection signal, an external sensing reset signal, and an external sensing control signal for sensing a characteristic value of the driving TFT disposed in the subpixel SP. The gate control signal may be supplied to the gate driving circuit 150 through the flexible circuit film 510, the at least one third pad part 230, the link line part 250, the second pad part 210, the routing portion 400, the first pad part 110, and gate control limes GCL.

The timing controller 570 may drive each of the driving IC 530 and the gate driving circuit 150 based on an external sensing mode during a predetermined external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the light emitting display apparatus, a process of powering off the light emitting display apparatus, a process of powering off the light emitting display apparatus after being driven for a long time, or a blank period of a frame which is set in real time or periodically.

The timing controller 570 according to an embodiment may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a light emitting display apparatus may be technology known to those skilled in the art, and thus, its detailed description is omitted. For example, the light emitting display apparatus according to an embodiment of the present disclosure may sense a characteristic value of the driving TFT disposed in each subpixel based on a sensing mode disclosed in Korean Patent Publication No. 10-2016-0093179, 10-2017-0054654, or 10-2018-0002099.

The power circuit 590 may be mounted on the PCB 550 and may generate various source voltages for displaying an image on the pixels P by using an input power supplied from the outside to provide the generated source voltage to a corresponding circuit. For example, the power circuit 590 may generate and output a logic source voltage for driving of each of the timing controller 570 and the driving IC 530, the plurality of reference gamma voltages provided to the driving IC 530, and at least one gate driving power and at least one gate common power for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 7:
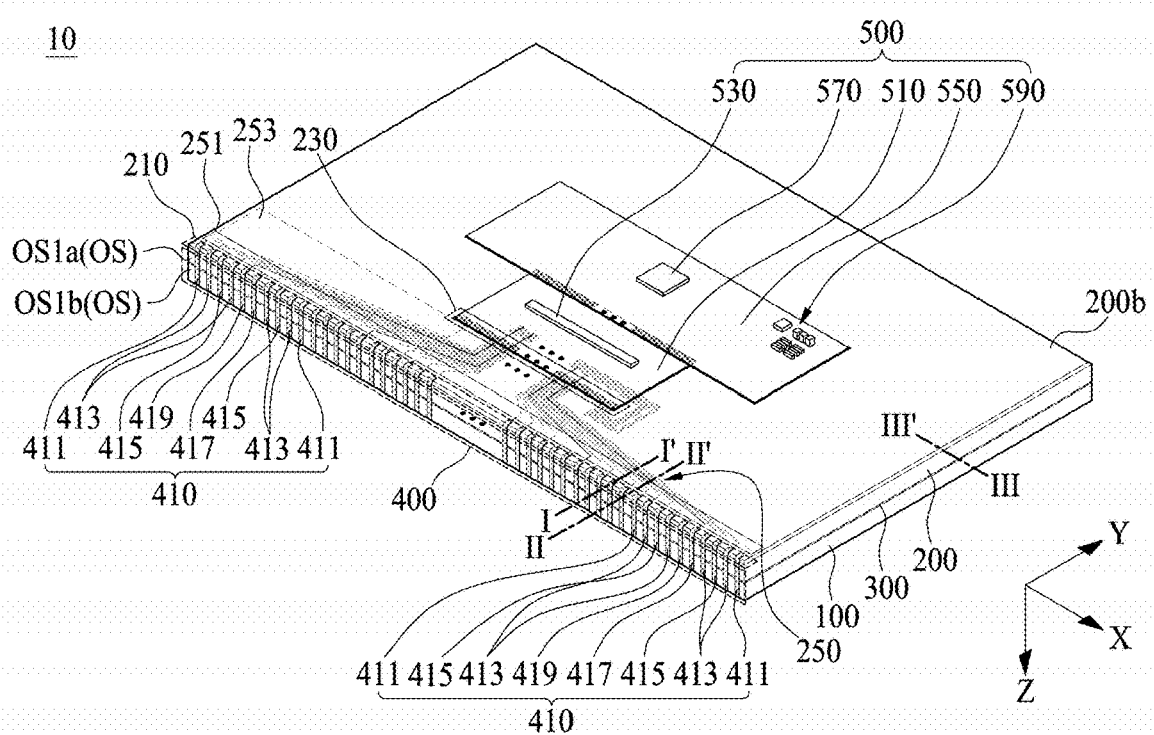
FIG. 7 is a diagram illustrating a rear surface of a light emitting display apparatus according to another embodiment of the present disclosure.

FIG. 7 is a rear perspective view illustrating a light emitting display apparatus according to another embodiment of the present disclosure, and illustrates an embodiment where a wiring substrate is additionally provided in the light emitting display apparatus illustrated in FIGS. 1 to 6.

Referring to FIG. 7, the light emitting display apparatus according to another embodiment of the present disclosure may include a substrate 100, a second substrate 200, a coupling member 300, and a routing portion 400.

The substrate 100 may be referred to as a display substrate, a pixel array substrate, an upper substrate, a front substrate, or a base substrate. The substrate 100 may be a glass substrate, or may be a thin glass substrate or a plastic substrate, which is bendable or flexible. In the following description of FIG. 7, the substrate 100 may be referred to as a first substrate 100.

The first substrate 100 may be substantially the same as the substrate 100 of the light emitting display apparatus illustrated in FIGS. 1 to 6, and thus, like reference numerals refer to like elements and their repetitive descriptions may be omitted.

The second substrate 200 may be referred to as a wiring substrate, a line substrate, a link substrate, a lower substrate, a rear substrate, or link glass. The second substrate 200 may be a glass substrate, or may be a thin glass substrate or a plastic substrate, which is bendable or flexible. For example, the second substrate 200 may include the same material as the first substrate 100. A size of the second substrate 200 may be the same as or substantially the same as the first substrate 100, but embodiments of the present disclosure are not limited thereto, the size of the second substrate 200 may have a smaller than the first substrate 100. For example, the second substrate 200 may be configured to have the same size as the first substrate 100 in order to maintain or secure the stiffness of the first substrate 100.

The second substrate 200 may include a second pad part 210, at least one third pad part 230, and a link line portion 250. Except for that the second pad part 210, the at least one third pad part 230, and the link line portion 250 are disposed at a rear surface (or a backside surface) 200*b* of the second substrate 200, each of the second pad part 210, the at least one third pad part 230, and the link line portion 250 may substantially the same as each of the second pad part 210, the at least one third pad part 230, and the link line portion 250 illustrated in FIG. 6, and thus, like reference numerals refer to like elements and their repetitive descriptions may be omitted.

The second substrate 200 may be coupled (or connected) to a second surface (or a rear surface) of the first substrate 100 by using the coupling member 300. The coupling member 300 may be interposed between the first substrate 100 and the second substrate 200. Thus, the first substrate 100 and the second substrate 200 may be opposite-bonded to each other by the coupling member 300.

The routing portion 400 may be referred to as a side routing portion, a side wiring portion, a printing wiring portion, or a printing line portion. The routing portion 400 according to an embodiment may include a plurality of routing lines 410 which are disposed at each of a first outer surface (or one surface) OS1*a* among the outer surface OS of the first substrate 100 and a first outer surface (or one surface) OS1*b* among the outer surface OS of the second substrate 200. Except for that the plurality of routing lines 410 is disposed to surround the first pad part 110 and the first outer surface OS1*a* of the first substrate 100 and the second pad portion 210 and the first outer surface OS1*b* of the second substrate 200, the routing portion 400 may substantially the same as the routing portion 400 illustrated in FIG. 6, and thus, like reference numerals refer to like elements and their repetitive descriptions may be omitted.

The light emitting display apparatus according to another embodiment of the present disclosure may further include a driving circuit part 500.

The driving circuit part 500 may include a flexible circuit film 510, a driving integrated circuit (IC) 530, a printed circuit board (PCB) 550, a timing controller 570, and a power circuit 590. Except for that the flexible circuit film 510 is coupled to the at least one third pad part 230 disposed at the rear surface 200*b* of the second substrate 200, the driving circuit part 500 having such a configuration may be substantially the same as the driving circuit part 500 illustrated in FIG. 6, and thus, like reference numerals refer to like elements and their repetitive descriptions may be omitted.

Figure 8:
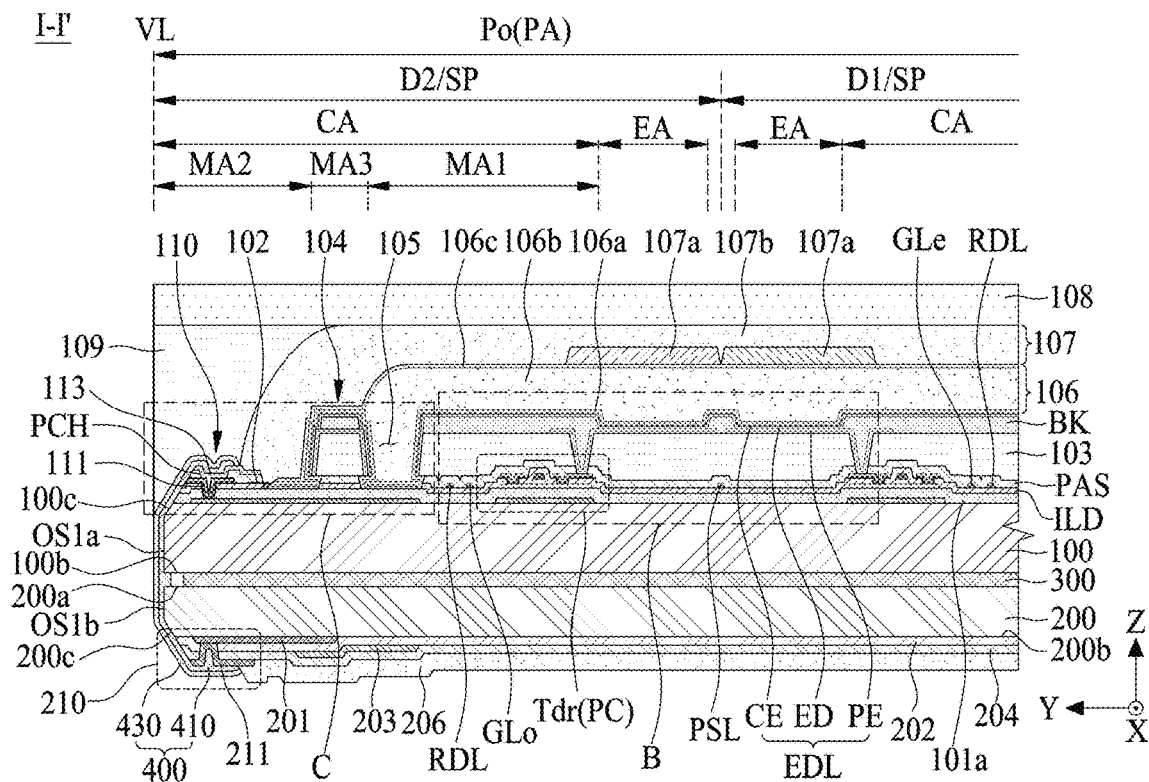
FIG. 8 is a cross-sectional view taken along line I-I' illustrated in FIG. 7.
Figure 9:
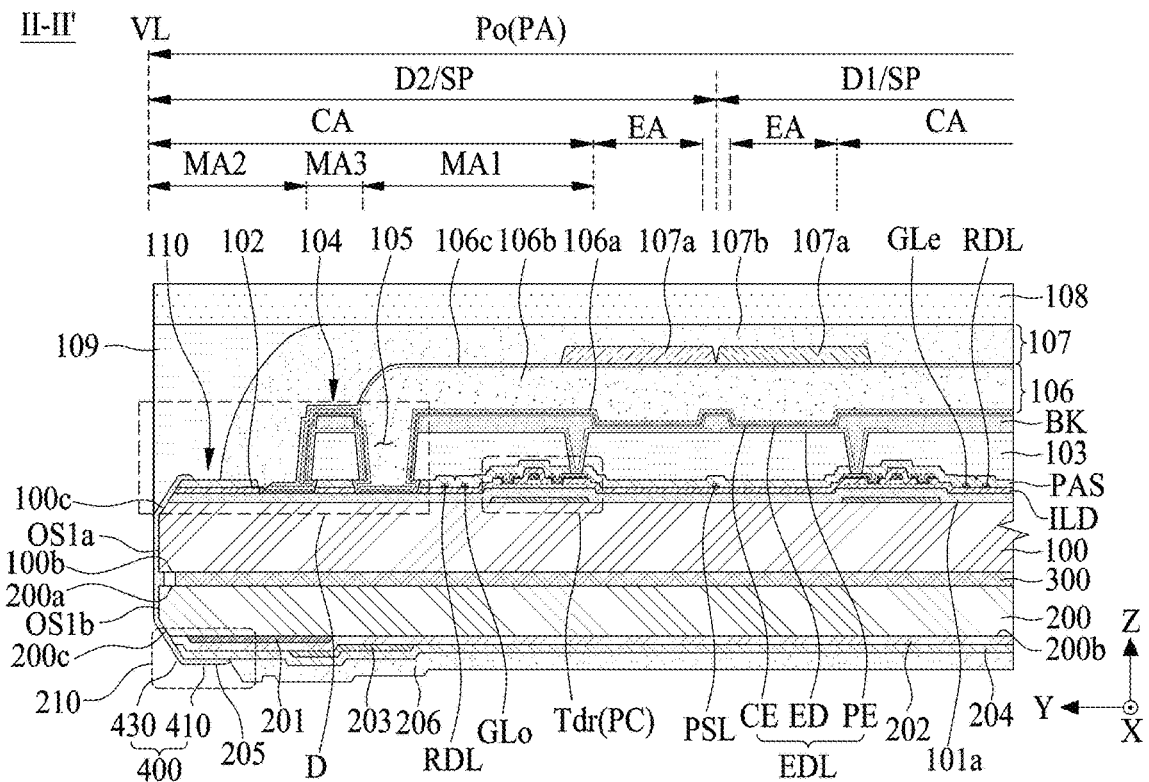
FIG. 9 is a cross-sectional view taken along line II-II' illustrated in FIG. 7.
Figure 10:
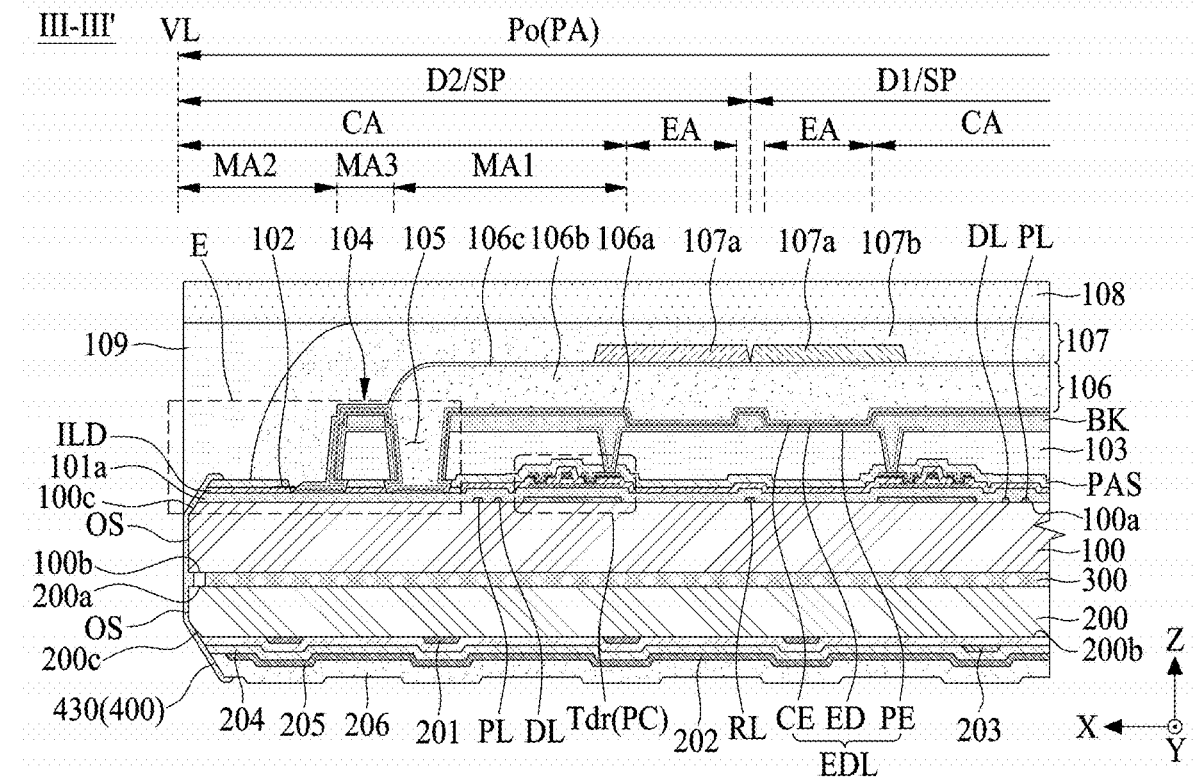
FIG. 10 is a cross-sectional view taken along line III-III' illustrated in FIG. 7.
Figure 11:
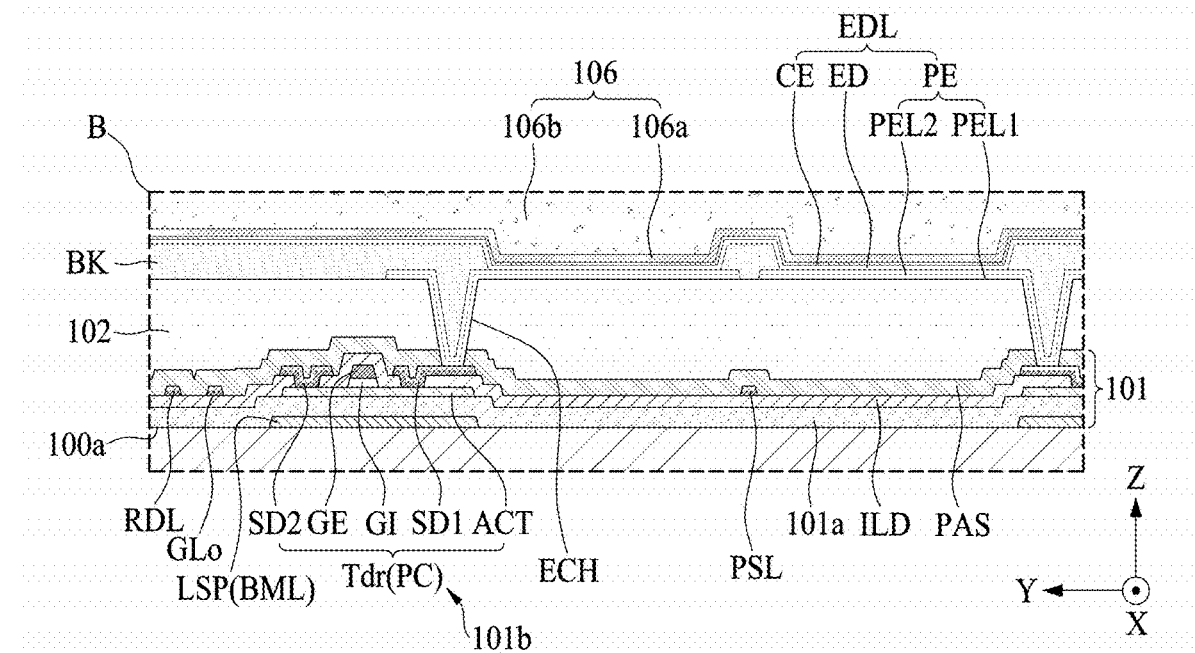
FIG. 11 is an enlarged view of a region 'B' illustrated in FIG. 8.

FIG. 8 is a cross-sectional view taken along line I-I' illustrated in FIG. 7, FIG. 9 is a cross-sectional view taken along line II-II' illustrated in FIG. 7, FIG. 10 is a cross-sectional view taken along line III-III' illustrated in FIG. 7, and FIG. 11 is an enlarged view of a region 'B' illustrated in FIG. 8. FIG. 8 is a cross-sectional view taken along the line I-I' passing through the pad illustrated in FIG. 7, and FIG. 9 is a cross-sectional view taken along the line II-II' passing between the pads illustrated in FIG. 7.

Referring to FIGS. 7 to 11, a light emitting display apparatus according to an embodiment of the present disclosure may include a first substrate 100, a second substrate 200, a coupling member 300, and a routing portion 400.

The first substrate 100 according to an embodiment of the present disclosure may include a circuit layer 101, a passivation layer PAS, a planarization layer 103, a light emitting device layer EDL, a bank BK, a dam 104, a groove line 105, and an encapsulation layer 106.

The circuit layer 101 may be disposed over the first substrate 100. The circuit layer 101 may be referred to as a pixel array layer or a TFT array layer.

The circuit layer 101 according to an embodiment may include a buffer layer 101*a*, a circuit array layer 101*b*, an interlayer insulation layer ILD, and a passivation layer PAS.

The buffer layer 101*a* may prevent materials, such as hydrogen included in the first substrate 100, from being diffused to the circuit array layer 101*b* in a high temperature process of a process of manufacturing a TFT. Also, the buffer layer 101*a* may prevent external water or moisture from penetrating into the light emitting device layer EDL. The buffer layer 101*a* according to an embodiment may include a single-layer structure including one of silicon oxide (SiOx), silicon nitride (SiNx), silicon oxynitride (SiONx), titanium oxide (TiOx), and aluminum oxide (AlOx) or a stacked structure thereof, but embodiments of the present disclosure are not limited thereto. For example, the buffer layer 101*a* may include a first buffer layer which includes SiNx and is disposed on the first substrate 100 and a second buffer layer which includes SiOx and is disposed on the first buffer layer.

The circuit array layer 101*b* may include a pixel circuit PC which includes a driving TFT Tdr disposed in each of a plurality of pixel areas PA over the buffer layer 101*a*.

The driving TFT Tdr disposed in a circuit area of the each pixel area PA may include an active layer ACT, a gate insulation layer GI, a gate electrode GE, an interlayer insulation layer ILD, a first electrode (source/drain) SD1, and a second electrode (source/drain) SD2.

The active layer ACT may be disposed on the buffer layer 101a in each pixel area PA. The active layer ACT may include a channel area, overlapping the gate electrode GE, and a first electrode (source/drain) area and a second electrode (source/drain) area parallel to each otherwith the channel area interposed therebetween. The active layer ACT may have conductivity in a conductivity process, and thus, may directly connect between lines in the display area AA. Also, the active layer ACT may be used as a bridge line of a jumping structure which electrically connects lines disposed on different layers.

The gate insulation layer GI may be disposed at the channel area of the active layer ACT. The gate insulation layer GI may insulate the active layer ACT from the gate electrode GE.

The gate electrode GE may be disposed on the gate insulation layer GI and coupled to the gate line. The gate electrode GE may overlap the channel area of the active layer ACT with the gate insulation layer GI therebetween.

The interlayer insulation layer ILD may be disposed at the first substrate 100 to cover the gate electrode GE and the active layer ACT. The interlayer insulation layer ILD may electrically insulate (or isolate) the gate electrode GE and the electrode (source/drain) s SD1 and SD2. For example, the interlayer insulation layer ILD may be referred to as an insulation layer or a first insulation layer.

The first electrode (source/drain) SD1 may be disposed on the interlayer insulation layer ILD overlapping the first electrode (source/drain) area of the active layer ACT and may be electrically coupled to the first electrode (source/drain) area of the active layer ACT through a first source/drain contact hole disposed in the interlayer insulation layer ILD. For example, the first electrode (source/drain) SD1 may be a source electrode of the driving TFT Tdr, and the first electrode (source/drain) area of the active layer ACT may be a source area.

The second electrode (source/drain) SD2 may be disposed on the interlayer insulation layer ILD overlapping the second electrode (source/drain) area of the active layer ACT and may be electrically coupled to the second electrode (source/drain) area of the active layer ACT through a second source/drain contact hole disposed in the interlayer insulation layer ILD. For example, the second electrode (source/drain) SD2 may be a drain electrode of the driving TFT Tdr, and the second electrode (source/drain) area of the active layer ACT may be a drain area.

Each of the first electrode (source/drain) SD1 and the second electrode (source/drain) SD2 has at least a two-layer structure including a first source/drain metal layer and a second source/drain metal layer over the first source/drain metal layer.

According to an embodiment, the first source/drain metal layer may include at least one material of molybdenum (Mo), titanium (Ti), and a Mo—Ti alloy (MoTi). The second source/drain metal layer may include at least one material of aluminum (Al), silver (Ag), and copper (Cu). For example, each of the first electrode (source/drain) SD1 and the second electrode (source/drain) SD2 may include a two-layer structure of Cu/MoTi, but embodiments of the present disclosure are not limited thereto.

Each of the first electrode (source/drain) SD1 and the second electrode (source/drain) SD2 may be used as a metal layer (or a line) disposed in parallel to the first direction X among the pixel driving lines DL, GL, PL, CVL, RL, and GCL disposed at the first substrate 100. For example, each of the first electrode (source/drain) SD1 and the second electrode (source/drain) SD2 may be formed together with the gate line GL or the like disposed in parallel to the first direction X at the display area AA.

Each of first and second switching TFT Tsw1 and Tsw2 configuring the pixel circuit PC may be formed together with the driving TFT Tdr, and thus, their repetitive descriptions are omitted.

The circuit layer 101 according to an embodiment may further include a lower metal layer BML which is disposed between the first substrate 100 and the buffer layer 101a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically coupled to the first electrode (source/drain) SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a metal layer (or a line) disposed in parallel to the second direction Y among the pixel driving lines DL, GL, PL, CVL, RL, and GCL disposed at the first substrate 100.

The passivation layer PAS may be disposed over the first substrate 100 to cover the pixel circuit PC including the driving TFT Tdr. The passivation layer PAS may cover the circuit layer 101 including the driving TFT Tdr disposed at each of the pixel areas PA.

The passivation layer PAS according to an embodiment may be formed of an inorganic material. For example, the passivation layer PAS may include a single-layer structure including one of silicon oxide (SiOx), silicon nitride (SiNx), silicon oxynitride (SiONx), titanium oxide (TiOx), and aluminum oxide (AlOx) or a stacked structure thereof. For example, the passivation layer PAS may be referred to as a protection layer, a circuit protection layer, a circuit insulation layer, an inorganic insulation layer, a first inorganic insulation layer, or a second insulation layer, or the like.

The planarization layer 103 may be disposed over the first substrate 100 on which the circuit layer 101 is disposed and may provide a flat surface over the circuit layer 101. The planarization layer 103 may cover the circuit layer 101 including the driving TFT Tdr disposed at each of the plurality of pixel areas PA. For example, the planarization layer 103 may be disposed over the passivation layer PAS and may provide a flat surface over the passivation layer PAS.

The planarization layer 103 according to an embodiment may be formed to cover the remaining circuit layer 101 except for the circuit layer 101 disposed at a periphery portion of the first substrate 100 or the outermost pixel Po. For example, the planarization layer 103 may be disposed between the first substrate 100 and the light emitting device layer EDL or below the light emitting device layer EDL. The planarization layer 103 according to an embodiment may be formed of an organic material, but embodiments of the present disclosure are not limited thereto. For example, the planarization layer 103 may be formed of an organic material which includes acrylic resin, epoxy resin, phenolic resin, polyamide-based resin, polyimide-based resin, or the like, but embodiments of the present disclosure are not limited thereto.

The light emitting device layer EDL may be disposed over the planarization layer 103. The light emitting device layer EDL according to an embodiment may include a pixel electrode PE, a self-emitting device ED, and a common electrode CE.

The pixel electrode PE may be referred to as an anode electrode, a reflective electrode, a lower electrode, an anode, or a first electrode, of the self-emitting device ED.

The pixel electrode PE may be disposed over the planarization layer 103 overlapping an emission area EA of each of the plurality of subpixel SP of the first substrate 100. The pixel electrode PE may be patterned in an island shape and disposed in each subpixel SP, and may be electrically coupled to the first electrode (source/drain) SD1 of the driving TFT Tdr of a corresponding pixel circuit PC. For example, one side of the pixel electrode PE may extend onto the first electrode (source/drain) SD1 of the driving TFT Tdr and may be electrically coupled to the first electrode (source/drain) SD1 of the driving TFT Tdr through an electrode contact hole ECH provided at the planarization layer 103.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited over the planarization layer 103 and then simultaneously patterned, but embodiments of the present disclosure are not limited thereto.

The first pixel electrode layer PEL1 may disposed over the planarization layer 103. The second pixel electrode layer PEL2 may disposed (or stacked) on the first pixel electrode layer PEL1. For example, the first pixel electrode layer PEL1 may act as an adhesive layer corresponding to the planarization layer 103 and may act as a secondary electrode of the self-emitting device ED, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one or more material of aluminum (Al), silver (Ag), molybdenum (Mo), titanium (Ti), and a Mo—Ti alloy (MoTi), but embodiments of the present disclosure are not limited thereto. For example, the pixel electrode PE according to an embodiment may be formed in a two-layer structure of ITO/MoTi or IZO/MoTi.

The pixel electrode PE according to another embodiment may have a three-layer structure including a first pixel electrode layer PEL1, a second pixel electrode layer PEL2 on the first pixel electrode layer PEL1, and a third pixel electrode layer (or a third metal layer) on the second pixel electrode layer PEL2. The first pixel electrode layer PEL1, the second pixel electrode layer PEL2, and the third pixel electrode layer may be sequentially deposited over the planarization layer 103 and then simultaneously patterned, but embodiments of the present disclosure are not limited thereto.

The third pixel electrode layer may act as an electrode of the self-emitting device ED and may include ITO or IZO. For example, the pixel electrode PE according to another embodiment may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) on the second pixel electrode layer PEL2, and a fourth pixel electrode layer (or a fourth metal layer) on the third pixel electrode layer. The first to fourth pixel electrode layers may be sequentially deposited over the planarization layer 103 and then simultaneously patterned, but embodiments of the present disclosure are not limited thereto.

In the pixel electrode PE of the four-layer structure, the first pixel electrode layer may act as the adhesive layer corresponding to the planarization layer 103 and may act as the secondary electrode of the self-emitting device ED, and moreover, may include one or more material of ITO, Mo, and Mo—Ti. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the self-emitting device ED and may include ITO or IZO. For example, the pixel electrode PE according to another embodiment may be formed in a four-layer structure of ITO/Cu/MoTi/ITO.

The pixel electrode PE according to another embodiment may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The self-emitting device ED may be disposed over the first substrate 100. The self-emitting device ED may be formed over the pixel electrode PE and may directly contact the pixel electrode PE. For example, the pixel electrode PE may be disposed between the planarization layer 103 and the self-emitting device ED. The pixel electrode PE may be disposed under (or below) the self-emitting device ED.

The self-emitting device ED according to an embodiment may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). For example, the self-emitting device ED according to another embodiment may include an organic light emitting device, or may include a stacked or a combination structure of an organic light emitting device and a quantum dot light emitting device. For example, the self-emitting device ED according to another embodiment may include an organic light emitting layer or an inorganic light emitting layer, or may include a stacked or a combination structure of an organic light emitting layer (or an inorganic light emitting layer) and a quantum dot light emitting layer.

The organic light emitting device may include two or more organic light emitting parts for emitting white light (or blue light). For example, the organic light emitting device may include a first organic light emitting part and a second organic light emitting part for emitting white light based on a combination of first light and second light. For example, the first organic light emitting part may include at least one or more of a blue light emitting layer, a green light emitting layer, a red light emitting layer, a yellow light emitting layer, and a yellow-green light emitting layer. The second organic light emitting part may include at least one or more of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device according to an embodiment may further include at least one or more function layers for enhancing emission efficiency and/or lifetime. For example, the function layer may be disposed upper and/or under a light emitting layer.

The common electrode CE may be disposed over the display area AA of the first substrate 100 and may be electrically coupled to the self-emitting device ED of each of the plurality of pixels P. For example, the common electrode CE may be disposed over the remaining display area AA of the first substrate 100 except for the periphery portion of the first substrate 100. For example, the common electrode CE may be disposed over the remaining display area AA of the first substrate 100 except for the first pad part 110 of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO$_2$:Sb.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank BK may be disposed over the planarization layer 103 to define the pixel areas PA over the first substrate 100. The bank BK may be disposed over the planarization layer 103 to cover a periphery portion of the pixel electrode PE. The bank BK may define the emission area EA (or an opening portion) of each of the plurality of subpixels SP and may electrically isolate the pixel electrodes PE disposed in adjacent subpixels SP. The bank BK may be formed to cover the electrode contact hole ECH disposed in each of the plurality of pixel areas PA. The bank BK may be covered by the self-emitting device ED of the light emitting device layer EDL. For example, the self-emitting device ED may be disposed over the bank BK as well as over the pixel electrode PE of each of the plurality of subpixels SP.

The bank BK according to an embodiment may be a transparent bank including a transparent material or a black bank (or an opaque bank) including a black pigment.

Referring to FIGS. 8 to 10, the dam 104 may be disposed at a periphery portion of the first substrate 100 or a periphery portion of the outermost pixel Po. For example, the dam 104 may be provided as an element of each of the outermost pixels Po disposed at the periphery portion of the first substrate 100, and thus, the outermost pixels Po may have a structure which differs from inner pixels.

The dam 104 may be disposed over the circuit layer 101 at the periphery portion of the first substrate 100 or the periphery portion of the outermost pixel Po to have a closed loop line shape. For example, the dam 104 may be disposed over the circuit layer 101 to have a closed loop line shape surrounding the display area AA and may be supported by the buffer layer 101a of the circuit layer 101. For example, the dam 104 may be implemented to isolate the self-emitting device ED disposed at the periphery portion of the first substrate 100 or the periphery portion of each of the outermost pixels Po. The dam 104 will be described below.

The device isolation portion 102 may be disposed at the circuit layer 101 disposed at the periphery portion of the first substrate 100 or the periphery portion of each of the outermost pixels Po to have a closed loop line shape surrounding the dam 104. One periphery portion of the device isolation portion 102 according to an embodiment may be implemented to include a protrusion tip structure which protrudes toward the dam 104. For example, the device isolation portion 102 may be disposed between an interlayer insulation layer ILD and a passivation layer PAS. The device isolation portion 102 will be described below.

The groove line 105 may be disposed in a groove region (or a ditch region) defined at an inner region of the dam 104. According to an embodiment, the groove line 105 may be disposed over the circuit layer 101 to have a closed loop line shape between an end of the planarization layer 103 and the dam 104. For example, the groove line 105 may be formed or implemented by removing all of the planarization layer 103 and the passivation layer PAS disposed in the groove region of the inner region of the dam 104. For example, the groove line 105 may be implemented to expose a partial region of the buffer layer 101a disposed between an end of the planarization layer 103 and the dam 104. Also, the groove line 105 may be implemented to isolate the self-emitting device ED disposed at the periphery portion of the first substrate 100 or the periphery portion of each of the outermost pixels Po. The groove line 105 will be described below.

The encapsulation layer 106 may be disposed over the remaining portion of the first substrate 100 except for an outermost periphery portion of the first substrate 100 and may be implemented to cover the light emitting device layer EDL. For example, the encapsulation layer 106 may be disposed over the remaining portion of the first substrate 100 except for a portion between an outer surface OS of the first substrate 100 and a device isolation portion 102 and may be implemented to cover the light emitting device layer EDL and the dam 104. For example, the encapsulation layer 106 may be implemented over the first substrate 100 to surround all of the front surface and lateral surfaces of the light emitting device layer EDL. The encapsulation layer 106 may be implemented to surround all of the front surface and lateral surfaces of the light emitting device layer EDL, and thus, may prevent oxygen or water (or moisture) from penetrating into the light emitting device layer EDL, thereby improving the reliability of the light emitting device layer EDL by oxygen or water (or moisture).

The encapsulation layer 106 according to an embodiment of the present disclosure may include first to third encapsulation layers 106a to 106c.

The first encapsulation layer 106a may be implemented to prevent oxygen or water from penetrating into the light emitting device layer EDL. The first encapsulation layer 106a may be disposed over the common electrode CE and may surround the light emitting device layer EDL. Therefore, all of a front surface and lateral surfaces of the light emitting device layer EDL may be surrounded by the first encapsulation layer 106a.

The first encapsulation layer 106a according to an embodiment may be disposed over the remaining portion of the first substrate 100 except for a portion between an outer surface OS of the first substrate 100 and the device isolation portion 102 and may be implemented to cover the light emitting device layer EDL and the dam 104. For example, an end portion of the first encapsulation layer 106a may be disposed under (or below) the device isolation portion 102.

According to an embodiment, the first encapsulation layer 106a may be disposed over the light emitting device layer EDL, and may directly contacts an uppermost surface (or a surface) of the buffer layer 101a at the periphery portion of the first substrate 100 or the outermost pixels Po, and thus, the first encapsulation layer 106a may fully surround or seal the light emitting device layer EDL including the self-emitting device ED isolated by the device isolation portion 102, the dam 104, and the groove line 105. Therefore, the first encapsulation layer 106a may fully surround or seal each of an isolation surface (or a separation surface) of the isolated self-emitting device ED and common electrode CE, thereby fundamentally (or completely) preventing the lateral penetration of water (or moisture).

The first encapsulation layer 106a according to an embodiment may include an inorganic insulating material. For example, the first encapsulation layer 106a may include a single-layer structure including one of silicon oxide (SiOx), silicon nitride (SiNx), silicon oxynitride (SiONx), titanium oxide (TiOx), and aluminum oxide (AlOx) or a stacked structure thereof.

The second encapsulation layer 106b may be implemented on the first encapsulation layer 106a disposed at an encapsulation region defined by the dam 104 to have a thickness which is relatively thicker than the first encapsulation layer 106a. The second encapsulation layer 106b may have a thickness for fully cover particles (or an undesired material or an undesired structure element) which is or may be on the first encapsulation layer 106a. The second encapsulation layer 106b may spread to the periphery portion of the first substrate 100 due to a relatively thick thickness, but the spread of the second encapsulation layer 106b may be blocked by the dam 104.

The second encapsulation layer 106b according to an embodiment may include an organic material or a liquid organic material. For example, the second encapsulation layer 106b may include an organic material such as SiOCz acrylic or epoxy-based resin. The second encapsulation layer 106b may be referred to as a particle cover layer, an organic encapsulation layer, or the like.

According to an embodiment, the second encapsulation layer 106b may smoothly spread to the dam 104 through the groove line 105, and thus, a non-filling phenomenon of the second encapsulation layer 106b may be prevented from occurring in a region adjacent to an inner portion of the dam 104. For example, the spread of the second encapsulation layer 106b may smoothly travel to the dam 104 through the groove line 105 without being hindered by other structures, and thus, the second encapsulation layer 106b may be completely filled up to the region adjacent to the inner portion of the dam 104.

According to an embodiment, when an inner trench structure for isolating the light emitting device layer EDL instead of the groove line 105 is disposed at the inner region of the dam 104, the spread of the second encapsulation layer 106b may be hindered or blocked by a height and a step height of the inner trench structure and thus may not travel up to the dam 104, and due to this, the non-filling phenomenon of the second encapsulation layer 106b may occur at the region adjacent to the inner portion of the dam 104.

The third encapsulation layer 106c may be implemented to primarily prevent oxygen or water (or moisture) from penetrating into the light emitting device layer EDL. The third encapsulation layer 106c may be implemented to surround all of the second encapsulation layer 106b disposed at the inner portion of the dam 104 and the first encapsulation layer 106a disposed at an outer portion of the dam 104. The third encapsulation layer 106c according to an embodiment may include an inorganic material which is the same as or differs from the first encapsulation layer 106a.

The light emitting display apparatus or the first substrate 100 according to an embodiment of the present disclosure may include a first margin area MA1, a second margin area MA2, and a third margin area MA3.

The first margin area MA1 may be disposed between the dam 104 and the emission area EA of the outermost pixel Po. The first margin area MA1 may have a first width between the dam 104 and an end of the emission area EA (or a bank BK) of the outermost pixel Po, based on a reliability margin of the light emitting device layer EDL by the lateral penetration of water (or moisture). Accordingly, the dam 104 may be implemented to be spaced apart from the end of the emission area EA by a first width of the first margin area MA1 with respect to a first direction X. For example, the first width may be set to 30 µm to 102 µm, but embodiments of the present disclosure are not limited thereto.

The second margin area MA2 may be disposed between the dam 104 and the outer surface OS of the first substrate 100. The second margin area MA2 may have a second width between the dam 104 and the outer surface OS of the first substrate 100, based on a reliability margin of the light emitting device layer EDL by the lateral penetration of water (or moisture). Accordingly, the dam 104 may be implemented to be spaced apart from the outer surface OS of the first substrate 100 by a second width of the second margin area MA2 with respect to the first direction X. For example, the second margin area MA2 may be an area including the first pad part 110 and the device isolation portion 102. For example, the second width may be set to 100 µm to 140 µm, but embodiments of the present disclosure are not limited thereto.

The third margin area MA3 may be disposed between the first margin area MA1 and the second margin area MA2. The third margin area MA3 may have a third width corresponding to a width of a lowermost floor surface (or bottom surface) of the dam 104. For example, the third margin area MA3 may be an area including the dam 104. For example, the third width may be set to 40 µm to 60 µm, but embodiments of the present disclosure are not limited thereto.

With respect to the first direction X, a width of each of the first margin area MA1, the second margin area MA2, and the third margin area MA3 may be implemented so that a second interval D2 between a center portion of the outermost pixel Po and the outer surface OS of the first substrate 100 is half or less of a pixel pitch.

In the second margin area MA2, a periphery portion of each of the self-emitting device ED, the common electrode CE, the first encapsulation layer 106a, and the second encapsulation layer 106c disposed over the device isolation portion 102 may be removed by a patterning process. For example, the periphery portion of each of the self-emitting device ED, the common electrode CE, the first encapsulation layer 106a, and the second encapsulation layer 106c disposed over the device isolation portion 102 may be removed by a pad open process. In this case, an isolation pattern of each of the common electrode CE and the self-emitting device ED which are isolated by the device isolation portion 102 and are disposed in an island shape over the buffer layer 101a under the device isolation portion 102 may be maintained in a state where the isolation pattern is surrounded by the first encapsulation layer 106a.

Referring to FIGS. 3, and 7 to 9, the first substrate 100 according to an embodiment of the present disclosure may further include a first pad part 110.

The first pad part 110 may be disposed at one edge portion of the first substrate 100 and may be electrically coupled to the pixel driving lines DL, GL, PL, CVL, RL, and GCL in a one-to-one relationship.

The first pad part 110 according to an embodiment of the present disclosure may include a plurality of first pads 111 disposed within the circuit layer 101.

The plurality of first pads 111 may be divided (or classified) into first data pads DP, first gate pads GP, first pixel driving power pads PPP, first reference voltage pads RVP, and first pixel common voltage pads CVP.

Each of the plurality of first pads 111 may be disposed over the interlayer insulation layer ILD and may be electrically coupled to a corresponding line of the pixel driving lines DL, GL, PL, CVL, RL, and GCL through a pad electrode contact hole PEH passing through the interlayer insulation layer ILD and the buffer layer 101a. For example, each of the plurality of first pads 111 according to an embodiment may include the same material as electrodes (source/drain) of a TFT and may be together along with the electrodes (source/drain) of the TFT. The plurality of first pads 111 will be described below.

The first pad part 110 according to an embodiment of the present disclosure may further include a plurality of secondary pads 113.

Each of the plurality of secondary pads 113 may be disposed at the first pad part 110 so as to be electrically coupled to each of the plurality of first pads 111 in a one-to-one relationship. Each of the plurality of secondary pads 113 may be disposed over the passivation layer PAS of the first pad part 110 to cover each of the plurality of first pads 111. Each of the plurality of secondary pads 113 may be disposed over a corresponding first pad 111 of the plurality of first pads 111 and the passivation layer PAS and may have a length which is longer than the first pad 111. One side of each of the plurality of secondary pads 113 may be electrically and directly coupled to a corresponding first pad 111. Each of the plurality of secondary pads 113 according to an embodiment may include a single-layer structure including at least one of molybdenum (Mo), titanium (Ti), MoTi, copper (Cu), and silver (Ag).

According to an embodiment, the plurality of secondary pads 113 may be divided (or classified) into data secondary pads, gate secondary pads, pixel driving power secondary pads, reference voltage secondary pads, and pixel common voltage secondary pads.

Each of the plurality of secondary pads 113 according to an embodiment may have a line shape where the plurality of secondary pads 113 extend long along the second direction Y and are disposed spaced apart from one another along the first direction X or electrically separated from one another. For example, each of the plurality of secondary pads 113 may extend toward an inner portion of the display area AA from the outer surface OS of the first substrate 100 along the second direction Y.

Each of the plurality of secondary pads 113 according to an embodiment may have a second length (or a second width) which is relatively longer than a first length (or a first width) of a corresponding first pad 111. Each of the plurality of secondary pads 113 may have a length of tens μm with respect to a lengthwise direction thereof or the second direction Y. For example, with respect to the lengthwise direction or the second direction Y, when each of the plurality of first pads 111 has a length of 5 μm to 50 μm or less, each of the plurality of secondary pads 113 may have a length of 50 μm to 150 μm. For example, each of the plurality of secondary pads 113 may have a length which is greater than or equal to at least 1.5 times of a corresponding first pad 111.

As described above, each of the plurality of secondary pads 113 may be electrically and directly connected (or coupled) to a corresponding first pad 111, and thus, may extend a length of the corresponding first pad 111 to a length of tens μm and/or may increase a contact area between the first pad 111 and the routing portion 400. Therefore, the secondary pad 113 may be referred to as a secondary pad electrode, an extension pad, a connection pad, a pad extension electrode, a pad extension line, a pad connection electrode, a pad connection line, an additional pad, an auxiliary pad, or the like.

Referring again to FIGS. 8 to 10, the light emitting display apparatus or the first substrate 100 according to an embodiment of the present disclosure may further include a wavelength conversion layer 107 disposed over the encapsulation layer 106.

The wavelength conversion layer 107 may convert a wavelength of light which is incident thereon from an emission area of each pixel area PA. For example, the wavelength conversion layer 107 may convert white light (or blue light), which is incident thereon from the emission area, into color light corresponding to the subpixel SP or may transmit only color light corresponding to the subpixel SP. For example, the wavelength conversion layer 107 may include at least one of a wavelength conversion member and a color filter layer.

The wavelength conversion layer 107 according to an embodiment may include a plurality of wavelength conversion members 107a and a protection layer 107b.

The plurality of wavelength conversion members 107a may be disposed over the encapsulation layer 106 disposed at the emission area EA of each of the plurality of subpixel SP. For example, each of the plurality of wavelength conversion members 107a may be implemented to have the same size as or wider than the emission area EA of each subpixel area.

The plurality of wavelength conversion members 107a according to an embodiment may be divided (or classified) into a red light filter which converts white light into red light, a green light filter which converts white light into green light, and a blue light filter which converts white light into blue light. For example, the red light filter (or a first light filter) may be disposed over the encapsulation layer 106 in the emission area EA of the red subpixel SP, the green light filter (or a second light filter) may be disposed over the encapsulation layer 106 in the emission area EA of the green subpixel SP, and the blue light filter (or a third light filter) may be disposed over the encapsulation layer 106 in the emission area EA of the blue subpixel SP.

The plurality of wavelength conversion members 107a according to another embodiment may be disposed over the encapsulation layer 106 of each subpixel area. For example, each of the plurality of wavelength conversion members 107a may be disposed over the encapsulation layer 106 to overlap the entire corresponding subpixel SP.

The plurality of wavelength conversion members 107a according to another embodiment may be implemented to overlap each other at the encapsulation layer 106 overlapped with the circuit area CA (or the non-emission area) except for the emission area EA of each subpixel SP. For example, two or more wavelength conversion members 107a having different colors are disposed at the encapsulation layer 106 overlapping the circuit area CA (or non-emission area) except for the emission area EA of each subpixel SP. The two or more wavelength conversion members 107a disposed at the encapsulation layer 106 overlapping the circuit area CA (or non-emission area) may act as a function of a light blocking pattern which prevents color mixture between adjacent subpixels SP or between adjacent pixels P.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 106 where the wavelength conversion members 107a are not disposed. The protection layer 107b according to an embodiment may include an organic material. Alternatively, the protection layer 107b may further include a getter material for adsorbing water and/or oxygen.

Optionally, the wavelength conversion layer 107 according to another embodiment may include two or more layers wavelength conversion members 107a disposed over the encapsulation layer 106 overlapping the circuit area CA (or non-emission area) except for the emission area EA in each subpixel SP. The two or more layers wavelength conversion members 107a may act as a function of the light blocking pattern.

Alternatively, the wavelength conversion layer 107 may be changed to a wavelength conversion sheet having a sheet form and may be disposed over the encapsulation layer 106. In this case, the wavelength conversion sheet (or a quantum dot sheet) may include the wavelength conversion members 107a disposed between a pair of films. For example, when the wavelength conversion layer 107 includes a quantum dot which re-emits colored light set in a subpixel SP, the light emitting device layer EDL of a subpixel SP may be implemented to emit white light or blue light.

The light emitting display apparatus or the first substrate 100 according to an embodiment of the present disclosure may further include a functional film 108.

The functional film 108 may be disposed over the wavelength conversion layer 107. For example, the functional film 108 may be coupled to over the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize a color shift based on a viewing angle.

The light emitting display apparatus or the first substrate 100 according to an embodiment of the present disclosure may further include a side sealing member 109.

The side sealing member 109 may be formed between the first substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the light emitting display apparatus, between the functional film 108 and the first substrate 100. Also, the side sealing member 109 may cover a portion of the routing portion 400 coupled to the first pad part 110 of the first substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad part 110 of the first substrate 100 may prevent or minimize the reflection of external light caused by the first pads 111 disposed in the first pad part 110.

Optionally, the side sealing member 109 may further include a getter material for adsorbing water and/or oxygen.

The light emitting display apparatus or the first substrate 100 according to an embodiment of the present disclosure may further include a first chamfer 100c which is provided at a corner portion between the first surface 100a and the outer surface OS. The first chamfer 100c may reduce or minimize the damage of the corner portion of the first substrate 100 caused by a physical impact applied from the outside and may prevent a disconnection of the routing portion 400 caused by the corner portion of the first substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the pad electrodes 111 of the first pad part 110 disposed to contact the first chamfer 100c may include an inclined surface which is inclined by an angle corresponding to an angle of the first chamfer 100c by removing or polishing a corresponding portion thereof along with the corner portion of the first substrate 100 through the chamfer process.

For example, when the first chamfer 100c is formed at an angle of 45 degrees between the outer surface OS and the first surface 100a of the first substrate 100, the outer surfaces (or one ends) of the pad electrodes 111 of the first pad part 110 may be formed at an angle of 45 degrees.

Referring to FIGS. 7 to 10, the second substrate 200 according to an embodiment of the present disclosure may include a second pad part 210, at least one third pad part 230, and a link line portion 250, as described with reference to FIG. 7, and thus, their repetitive descriptions are omitted or may be brief.

The routing portion 400 may include a plurality of routing lines 410 which are disposed at each of the first outer surface (or one surface) OS1a of the outer surface OS of the first substrate 100 and the first outer surface (or one surface) OS1b of the outer surface OS of the second substrate 200.

Each of the plurality of routing lines 410 may be electrically coupled to the first pad part 110 and the second pad part 210 in one-to-one relationship. For example, each of the plurality of routing lines 410 may be electrically coupled to each of the secondary pads 113 of the first pad part 110 and each of the second pads 211 of the second pad part 210 in one-to-one relationship.

According to another embodiment, in each of the plurality of routing lines 410, one end portion thereof may surround a first chamfer 100c and the secondary pads 113 of the first pad part 110 disposed at a first edge portion of the first substrate 100, the other end portion thereof may surround a second chamfer 200c and the second pad 211 of the second pad part 210 disposed at a first edge portion of the second substrate 200, and a center portion thereof between the one end portion and the other end portion may surround each of the first outer surface OS1a of the first substrate 100 and the first outer surface OS1b of the second substrate 200. For example, the one end portion of each of the plurality of routing lines 410 may directly contact with both the uppermost surface and the side surface of the secondary pads 113. The other end portion of each of the plurality of routing lines 410 may directly contact with both the rearmost surface and the side surface of the second pads 211. For example, in a data routing line 410, one end portion thereof may be implemented to surround the first chamfer 100c and a data secondary pad of the first pad part 110 disposed at the first edge portion of the first substrate 100, the other end portion thereof may be implemented to surround the second chamfer 200c and a second data pad of the second pad part 210 disposed at a first edge portion of the second substrate 200, and a center portion thereof between the one end portion and the other end portion may be implemented to surround each of the first outer surface OS1a of the first substrate 100 and the first outer surface OS1b of the second substrate 200.

The second substrate 200 according to an embodiment may include a metal pattern layer disposed at a rear surface 200b thereof and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200b of a second substrate 200. The first metal layer 201 according to an embodiment may include a first metal pattern. For example, the first metal layer 201 may be referred to as a first link layer or a link line layer.

The first metal pattern according to an embodiment may have a two-layer structure (Cu/MoTi) of Cu and MoTi. The first metal pattern may be used as a link line of the link line part 250, and thus, its repetitive descriptions may be omitted.

The first insulation layer 202 may be implemented over the rear surface 200b of the second substrate 200 to cover the first metal layer 201. The first insulation layer 202 according to an embodiment may include an inorganic insulating material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer.

The second metal pattern according to an embodiment may have a two-layer structure (Cu/MoTi) of Cu and MoTi. The second metal pattern may be used as a plurality of gate link lines of a plurality of link lines in the link line part 250, but embodiments of the present disclosure are not limited thereto. For example, the second metal layer 203 may be used as a jumping line (or a bridge line) for electrically connecting the link lines which are formed of different metal materials on different layers in the link line part 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200b of the second substrate 200 to cover the second metal layer 203. The second insulation layer 204 according to an embodiment may include an inorganic insulating material.

The third metal layer 205 may be implemented over the second insulation layer 204. The third metal layer 205 according to an embodiment may include a third metal pattern. For example, the third metal layer 205 may be referred to as a third link layer or a pad electrode layer.

The third metal pattern according to an embodiment may have a stacked structure of at least two materials of ITO (or IZO), Mo, Ti, and MoTi. For example, the third metal pattern may have a three-layer structure any one of ITO/Mo/ITO, ITO/MoTi/ITO, IZO/Mo/ITO, or IZO/MoTi/ITO. The third metal pattern may be used as pads of the second pad part 210. For example, the pads of the second pad part 210 formed of the third metal layer 205 may be electrically coupled to the first metal layer 201 through the pad contact holes formed at the first and second insulation layers 202 and 204.

The third insulation layer 206 may be implemented over the rear surface 200b of the second substrate 200 to cover the third metal layer 205. The third insulation layer 206 according to an embodiment may include an organic material. For example, the third insulation layer 206 may include an insulating material such as photo acrylic, or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

Each of the plurality of second pads disposed at the second pad part 210 may be electrically coupled to a link line of a link line part 250 made of the first metal layer 201 or the second metal layer 203 disposed at the rear surface 200b of the second substrate 200, through a second pad contact hole disposed at the first and second insulation layers 202 and 204. For example, the second data pad may be electrically coupled to one end of a data link line through the second pad contact hole disposed at the first and second insulation layers 202 and 204.

The coupling member 300 according to an embodiment of present disclosure may be disposed between the first substrate 100 and the second substrate 200. The first substrate 100 and the second substrate 200 may be opposite-bonded to each other by the coupling member 300. The coupling member 300 according to an embodiment may be a transparent adhesive member or a double-sided tape including an optically clear adhesive (OCA), an optically clear resin (OCR), or a pressure sensitive adhesive (PSA). The coupling member 300 according to another embodiment may include a glass fiber.

The coupling member 300 according to an embodiment may be disposed at a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

The routing portion 400 according to an embodiment of present disclosure may include the plurality of routing lines 410 electrically coupling the first pad part 110 and the second pad part 210 in one-to-one relationship. This is as described with reference to FIG. 7, and thus, its repetitive description is omitted.

The light emitting display apparatus or the routing portion 400 according to an embodiment of present disclosure may include may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulation layer.

The edge coating layer 430 according to an embodiment of the present disclosure may be implemented to cover all of the first edge portion and the first outer surface OS1a of the first substrate 100 and the first edge portion and the first outer surface OS1b of the second substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize the reflection of external light caused by the plurality of routing lines 410 and the first pads 111 of the first pad part 110. As another embodiment, the edge coating layer 430 may implement (or configure) the outermost surface (or sidewall) of the light emitting display apparatus (or the display panel), and thus, may include an impact absorbing material (or substance) or a ductile material so as to prevent the damage of an outer surface OS of each of the first and second substrates 100 and 200. As another embodiment, the edge coating layer 430 may include a mixed material of a light blocking material and an impact absorbing material.

According to an embodiment, the edge coating layer 430 may be formed to surround one outer surface OS of each of the first and second substrates 100 and 200 on which the routing portion 400 is disposed.

According to another embodiment, as illustrated in FIGS. 7, 9, and 11, the edge coating layer 430 may be formed to surround all of the other outer surfaces OS as well as the one outer surface OS of each of the first and second substrates 100 and 200 on which the routing portion 400 is disposed. For example, the edge coating layer 430 may be formed to surround all outer surfaces OS of each of the first and second substrates 100 and 200. In this case, the one outer surface OS (or a first outer surface) of each of the first and second substrates 100 and 200 may be surrounded by the plurality of routing lines 410 and the edge coating layer 430. The other outer surfaces OS (or second to fourth outer surfaces), except the one outer surface OS, of each of the first and second substrates 100 and 200 may be surrounded by only the edge coating layer 430. For example, the first outer surface of each of the first and second substrates 100 and 200 may include the plurality of routing lines 410 and the edge coating layer 430, and the second to fourth outer surfaces, except the first outer surface, of each of the first and second substrates 100 and 200 may include only the edge coating layer 430.

According to an embodiment, when the plurality of routing lines 410 and the edge coating layer 430 disposed at the first outer surface are referred to as a first sidewall structure, and the edge coating layer 430 disposed at the second to fourth outer surfaces are referred to as a second sidewall structure, the first sidewall structure and the second sidewall structure may have different thicknesses (or widths). For example, a thickness (or a width) of the second sidewall structure may be thinner or narrower than a thickness (or a width) of the first sidewall structure by a thickness of the plurality of routing lines 410.

Figure 12:
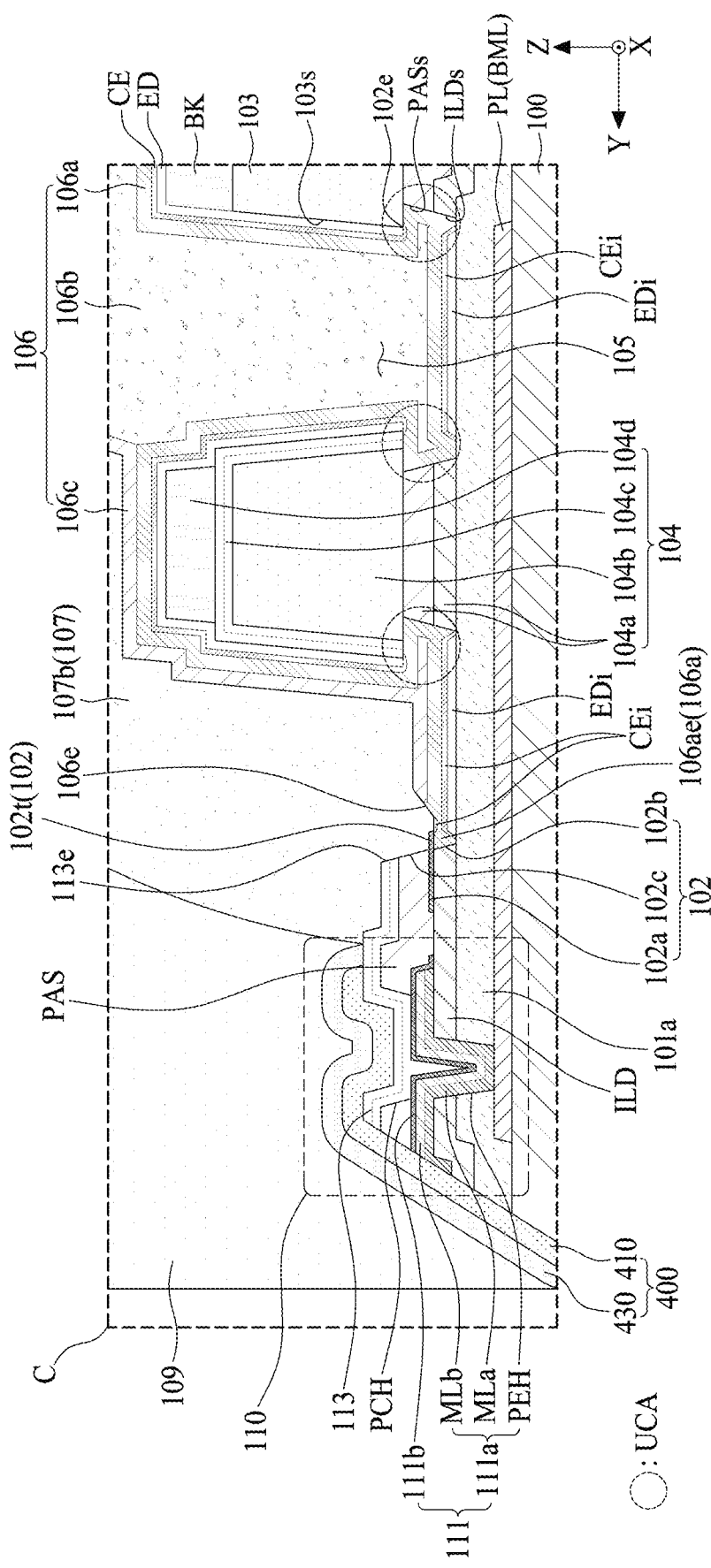
FIG. 12 is an enlarged view of a region 'C' illustrated in FIG. 8.
Figure 13:
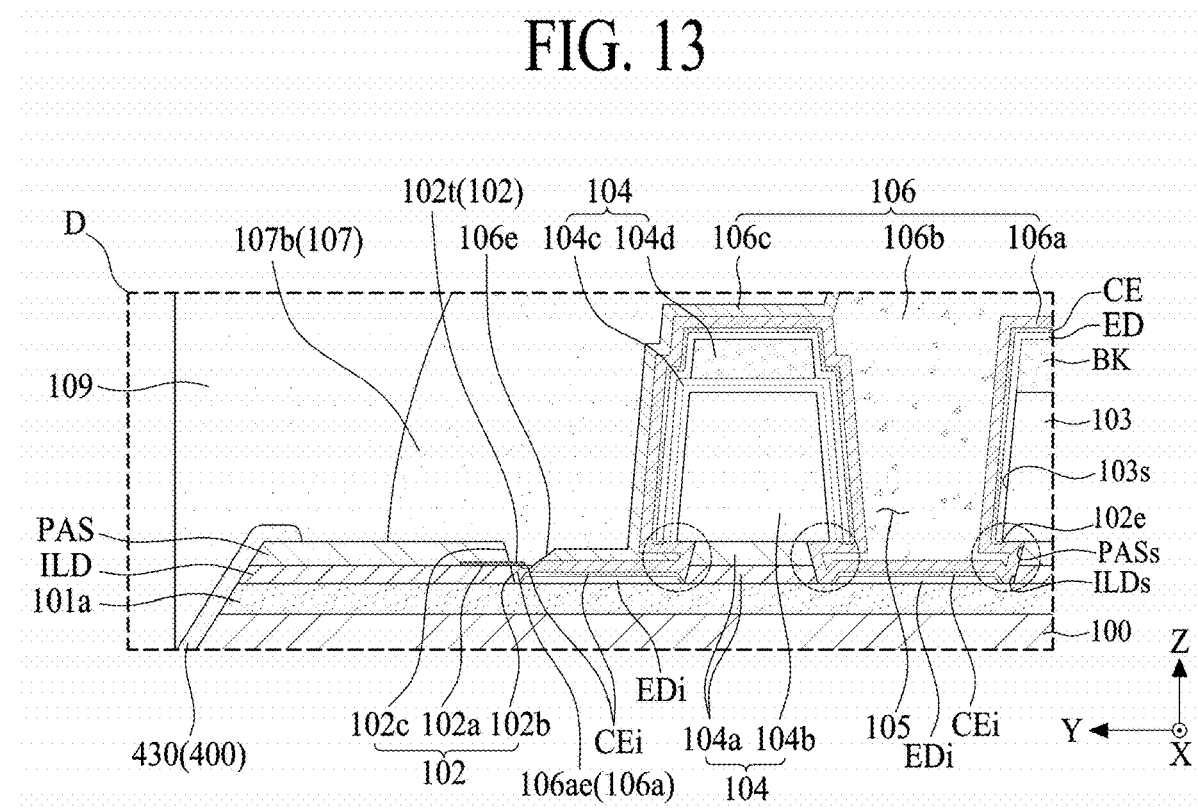
FIG. 13 is an enlarged view of a region 'D' illustrated in FIG. 9.
Figure 14:
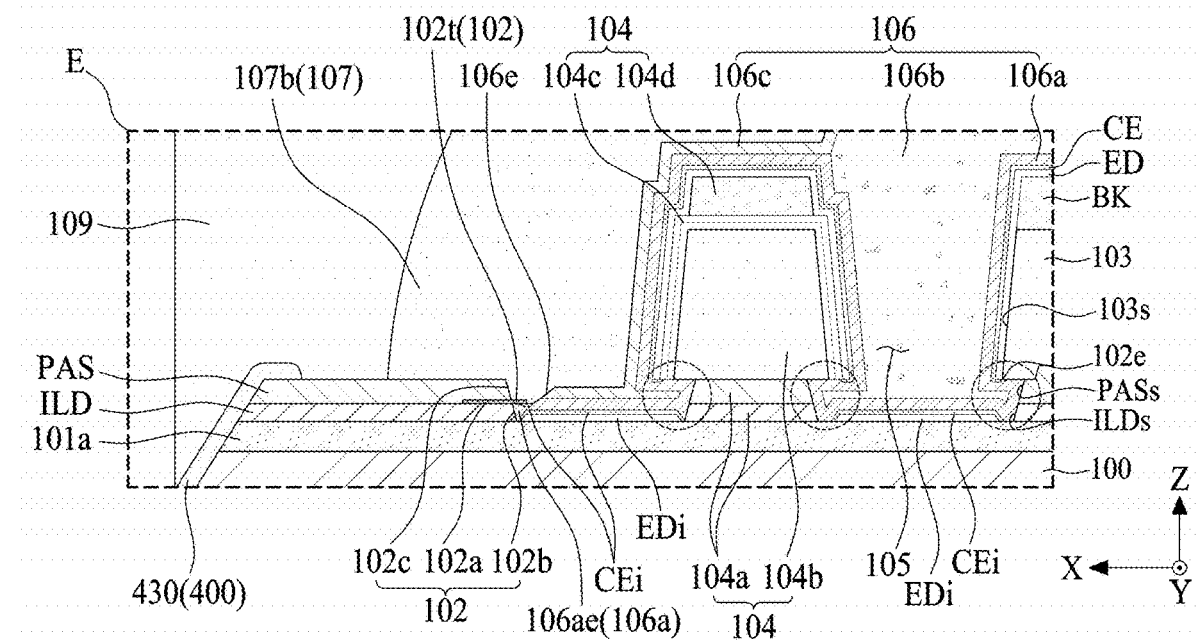
FIG. 14 is an enlarged view of a region 'E' illustrated in FIG. 10.

FIG. 12 is an enlarged view of a region 'C' illustrated in FIG. 8, FIG. 13 is an enlarged view of a region 'D' illustrated in FIG. 9, and FIG. 14 is an enlarged view of a region E illustrated in FIG. 10. The drawings are diagrams for describing the first pad part, the dam, the device isolation portion, and the groove line illustrated in FIG. 8.

Referring to FIGS. 8 and 12, a first pad part 110 according to an embodiment of the present disclosure may be disposed at one periphery portion of a first substrate 100, or may be disposed at a periphery portion of an outermost pixel Po disposed at the one periphery portion of the first substrate 100.

The first pad part 110 may include a plurality of first pads 111. Each of the plurality of first pads 111 according to an embodiment may include a pad electrode layer 111a and a pad cover layer 111b.

The pad electrode layer 111a may be disposed over the interlayer insulation ILD disposed in a pad area of the first substrate 100. The pad electrode layer 111a may have a length of 5 μm to 50 μm with respect to a lengthwise direction or a second direction Y. The pad electrode layer 111a may be electrically coupled to a corresponding line of the pixel driving lines DL, GL, PL, CVL, RL, and GCL through a pad electrode contact hole PEH passing through the interlayer insulation layer ILD and the buffer layer 101a. For example, the pad electrode layer 111a may be electrically coupled to a first pixel driving power line PL through the pad electrode contact hole PEH.

The pad electrode layer 111a according to an embodiment of the present disclosure may include the same material as electrodes (source/drain) of a thin film transistor (TFT) and may be formed together with the electrodes (source/drain) of the TFT.

The pad electrode layer 111a according to an embodiment may include a first pad metal layer MLa and a second pad metal layer MLb stacked on the first pad metal layer MLa. For example, the first pad metal layer MLa may include at least one material of molybdenum (Mo), titanium (Ti), and a Mo—Ti alloy (MoTi). The second pad metal layer MLb may include at least one material of aluminum (Al), silver (Ag), and copper (Cu). For example, the pad electrode layer 111a may include a two-layer structure of MoTi/Cu, but embodiments of the present disclosure are not limited thereto.

A pad cover layer 111b may be disposed over the interlayer insulation layer ILD to surround the pad electrode layer 111a. For example, the pad cover layer 111b may perform a function of preventing the corrosion of the pad electrode layer 111a. The pad cover layer 111b according to an embodiment may include a transparent conductive material. For example, the pad cover layer 111b may include indium tin oxide (ITO) or indium zinc oxide (IZO), but embodiments of the present disclosure are not limited thereto.

Each of the plurality of first pads 111 may be covered by the passivation layer PAS.

The first pad part 110 according to an embodiment of the present disclosure may further include a plurality of secondary pads 113 which are electrically and respectively coupled to the plurality of first pads 111.

The plurality of secondary pads 113 may be disposed over the passivation layer PAS to overlap each of the plurality of first pads 111 and may be individually coupled to each of the plurality of first pads 111 through a pad contact hole PCH passing through the passivation layer PAS.

Each of the plurality of secondary pads 113 according to an embodiment may include the same material as the pixel electrode PE and may be formed together with the pixel electrode PE, but embodiments of the present disclosure are not limited thereto. For example, each of the plurality of secondary pads 113 may be formed by a separate metal deposition process and patterning process and may include a single-layer structure including at least one material of Mo, Ti, MoTi, Cu, and Ag.

Each of the plurality of secondary pads 113 according to an embodiment may have a second length (or a second width) which is relatively longer than a first length (or a first width) of a corresponding first pad 111. Each of the plurality of secondary pads 113 may have a length of tens μm with respect to a lengthwise direction thereof or a second direction Y. For example, with the lengthwise direction or the second direction Y, when each of the plurality of first pads 111 has a length of 5 μm to 50 μm, each of the plurality of secondary pads 113 may have a length of 50 μm to 150 μm. For example, each of the plurality of secondary pads 113 may have a length which is longer than a corresponding first pad 111 by at least half or more thereof. Accordingly, each of the plurality of secondary pads 113 may have a function of extending a length of each of the plurality of first pads 111 to a length of tens μm and/or a function of increasing a contact area between the first pad 111 and the routing portion 400.

Referring to FIGS. 8, 10, and 12, a dam 104 according to an embodiment of the present disclosure may be disposed or formed to a closed loop line shape in the third margin area MA3 of the outermost pixel Po or the first substrate 100. The dam 104 may surround the groove line 105, and thus, the other side of the groove line 105 may be formed.

The dam 104 according to an embodiment may be disposed over the buffer layer 101a of the third margin area MA3 of the outermost pixel Po or the first substrate 100. For example, the dam 104 may be formed or implemented by a patterning process performed on each of the interlayer insulation layer ILD, the passivation layer PAS, the planarization layer 103, the pixel electrode material layer, and the bank BK disposed over the buffer layer 101a. The dam 104 may prevent the spread or overflow of the second encapsulation layer 106b (or an organic encapsulation layer) of the encapsulation layer 106, and moreover, may isolate (or disconnect) some layers of the light emitting device layer EDL.

The dam 104 according to an embodiment of the present disclosure may include a first dam pattern 104a, a second dam pattern 104b, a third dam pattern 104c, and a fourth dam pattern 104d.

The first dam pattern 104a may be implemented by the interlayer insulation layer ILD and the passivation layer PAS. For example, the first dam pattern 104a may be referred to as a base trench structure or a multi-layer trench structure.

The first dam pattern 104a according to an embodiment may have a two-layer structure of the interlayer insulation layer ILD and the passivation layer PAS. For example, the first dam pattern 104a may be formed or implemented by a portion (or a non-patterning region) of each of the interlayer insulation layer ILD and the passivation layer PAS which are not patterned (or removed) and remain over the buffer layer 101a through a patterning process performed on the interlayer insulation layer ILD and the passivation layer PAS disposed over the buffer layer 101a of the third margin area MA3 of the first substrate 100. Accordingly, the first dam pattern 104a may have the same height (or thickness) as a total height of the interlayer insulation layer ILD and the passivation layer PAS disposed over the buffer layer 101a.

A lateral surface of the first dam pattern 104a according to an embodiment of the present disclosure may be implemented in an inclined structure or a forward tapered structure. A lower surface of the first dam pattern 104a may directly contact an upper surface of the buffer layer 101a, and a top surface of the first dam pattern 104a may be disposed on the lower surface of the first dam pattern 104a and may have a width which is narrower than the lower surface. In the first dam pattern 104a, lateral surface may be formed to be inclined between the top surface and the lower surface. In the first dam pattern 104a, an included angle between the lower surface and the lateral surface may be an acute angle, and an included angle between the top surface and the lateral surface may be an obtuse angle. For example, a cross-sectional surface of the first dam pattern 104a taken along a widthwise direction may have a cross-sectional structure having a trapezoid shape where a top side is narrower than a lower side.

The second dam pattern 104b may be disposed on the first dam pattern 104a.

The second dam pattern 104b according to an embodiment may include an organic insulating material. For example, the second dam pattern 104b may include the same material as the planarization layer 103. For example, the second dam pattern 104b may have the same height (or thickness) as the planarization layer 103, or may have a height which is higher than the planarization layer 103. For example, a height (or thickness) of the second dam pattern 104b may be two times a height (or thickness) of the planarization layer 103. The second dam pattern 104b may be formed or implemented by a portion (or a non-patterning region) of the planarization layer 103 which remains without being patterned (or removed) by a patterning process performed on the planarization layer 103.

The second dam pattern 104b according to an embodiment of the present disclosure may have a width which is wider than the top surface of the first dam pattern 104a. The second dam pattern 104b may have a width which is the same as the lower surface of the first dam pattern 104a. A lateral surface of the second dam pattern 104b may be implemented in an inclined structure or a forward tapered structure. For example, the second dam pattern 104b taken along a widthwise direction may have a cross-sectional structure having a trapezoid shape which is the same as the first dam pattern 104a. With respect to the widthwise direction, each of one periphery portion and the other periphery portion of the second dam pattern 104b may protrude to the outside of the lateral surface of the first dam pattern 104a. For example, a distance between an end of the lateral surface of the second dam pattern 104b and the lateral surface of the first dam pattern 104a may be greater than a thickness obtained by summating a thickness of the self-emitting device ED and a thickness of the common electrode CE.

According to an embodiment, the lateral surface of the first dam pattern 104a may have an undercut structure with respect to the second dam pattern 104b. For example, the dam 104 may include an undercut area UCA disposed at an upper lateral surface of the first dam pattern 104a or a boundary portion between the first dam pattern 104a and the second dam pattern 104b. The undercut area UCA between the first dam pattern 104a and the second dam pattern 104b may be a structure for isolating (or disconnecting) each of the self-emitting device ED and the common electrode CE disposed on the dam 104. For example, the undercut area UCA between the first dam pattern 104a and the second dam pattern 104b may be formed or implemented by an over-etching process performed on each of the interlayer insulation layer ILD and the passivation layer PAS. The second dam pattern 104b may protrude to the outside of the lateral surface of the first dam pattern 104a and may cover the lateral surface of the first dam pattern 104a. Accordingly, the second dam pattern 104b may have an caves structure with respect to the first dam pattern 104a.

The third dam pattern 104c may be disposed to surround the second dam pattern 104b. For example, the third dam pattern 104c may be disposed on the upper surface and the lateral surface of the second dam pattern 104b and may surround the upper surface and the lateral surface of the second dam pattern 104b.

The third dam pattern 104c may include a metal material. The third dam pattern 104c according to an embodiment may include a metal layer having an at least two-layer structure which is the same as the pixel electrode PE. For example, the third dam pattern 104c may include a first metal layer, which is formed together with a first pixel electrode layer of the pixel electrode PE and directly contacts the top surface of the second dam pattern 104b, and a second metal layer which is formed together with a second pixel electrode layer of the pixel electrode PE and is disposed (or stacked) on the first metal layer. The third dam pattern 104c may be formed or implemented by a portion (or a non-patterning region) of the pixel electrode material which remains on the top surface and the lateral surface of the second dam pattern 104b without being patterned (or removed) by a patterning process performed on the pixel electrode PE.

The fourth dam pattern 104d may be stacked on the third dam pattern 104c. The fourth dam pattern 104d may have a width which is less than or equal to a top surface of the third dam pattern 104c. A lateral surface of the fourth dam pattern 104d may be implemented in an inclined structure or a forward tapered structure. For example, the fourth dam pattern 104d taken along a widthwise direction may have a cross-sectional structure having a trapezoid shape which is the same as the second dam pattern 104b.

The fourth dam pattern 104d according to an embodiment may include an organic insulating material or an inorganic insulating material. For example, the fourth dam pattern 104d may be stacked on the top surface of the third dam pattern 104c and may include the same material as the bank BK. The fourth dam pattern 104d may be formed or implemented by a portion (or a non-patterning region) of the bank BK which remains on the third dam pattern 104c without being patterned (or removed) by a patterning process performed on the bank BK.

Referring to FIGS. 8, 10, and 12, a device isolation portion 102 according to an embodiment of the present disclosure may be disposed in a closed loop line shape in the second margin area MA2 of the outermost pixel Po or the first substrate 100 and may surround the dam 104. For example, the device isolation portion 102 may be disposed in a closed loop line shape between the outer surface OS of the first substrate 100 and the dam 104. For example, the device isolation portion 102 disposed at one periphery portion of the first substrate 100 may be disposed between the first pad part 110 and the dam 104 and may overlap at least a portion of the first pad part 110. Also, the device isolation portion 102 disposed at the other periphery portion, except the one periphery portion, of the first substrate 100 may be disposed between the outer surface OS of the first substrate 100 and the dam 104.

The device isolation portion 102 according to an embodiment may include a device isolation line 102a and an undercut structure 102b.

The device isolation line 102a may include a protrusion tip 102t which protrudes from the circuit layer 101 to the dam 104.

The device isolation line 102a according to an embodiment may be disposed between the passivation layer PAS and the interlayer insulation layer ILD of the circuit layer 101.

The device isolation line 102a may be implemented as one metal layer of metal layers disposed in the circuit layer 101. The device isolation line 102a according to an embodiment of the present disclosure may include a transparent conductive metal material. For example, the device isolation line 102a may include ITO or IZO, but embodiments of the present disclosure are not limited thereto. The device isolation line 102a may include the same material as a pad cover layer 111b of the first pad part 110 and may be formed together with the pad cover layer 111b. Accordingly, the device isolation line 102a may be disposed on the same layer as the first pads 111.

The undercut structure 102b may be formed by removing the interlayer insulation layer ILD disposed under (or below) the device isolation line 102a. The undercut structure 102b may be implemented by an inclined structure or a forward tapered structure where a lateral surface of the interlayer insulation layer ILD disposed under the device isolation line 102 is inclined. For example, the undercut structure 102b may be primarily formed by a patterning process performed on the interlayer insulation layer ILD and the passivation layer PAS disposed between the device isolation line 102a and the dam 104. The undercut structure 102b may be formed by additionally patterning the interlayer insulation layer ILD disposed under the device isolation line 102a through an over-etching process which uses the device isolation line 102a as a mask and is performed on the interlayer insulation layer ILD. Accordingly, the protrusion tip 102t of the device isolation line 102a may have an caves structure with respect to the undercut structure 102b.

According to an embodiment, the protrusion tip 102t of the device isolation line 102a may be exposed over the buffer layer 101a between the device isolation line 102a and the dam 104 by removing the interlayer insulation layer ILD and the passivation layer PAS disposed between the device isolation line 102a and the dam 104 through a process of forming the first dam pattern 104a of the dam 104. Accordingly, the protrusion tip 102t of the device isolation line 102a may protrude toward the dam 104 from each of the undercut structure 102b and a lateral surface 102c of the passivation layer PAS covering the device isolation line 102a. Alternatively, the protrusion tip 102t of the device isolation line 102a may protrude from a lateral surface of the interlayer insulation layer ILD to the dam 104. The protrusion tip 102t of the device isolation line 102a may be a structure material for isolating (or disconnecting) each of the common electrode CE and the self-emitting device ED disposed over the device isolation portion 102.

According to an embodiment, as illustrated in FIG. 12, the device isolation line 102a disposed at the one periphery portion of the first substrate 100 may be spaced apart from each of the first pads 111 of the first pad part 110 and may be electrically (or spatially) separated (or disconnected) from each of the first pads 111. For example, when the device isolation line 102a is electrically coupled to the first pads 111, there may be a problem where the first pads 111 are not electrically separated (or disconnected) from one another and are electrically coupled to one another by the device isolation line 102a having a closed loop line shape.

At least a portion of the device isolation line 102a disposed at the one periphery portion of the first substrate 100 may overlap the secondary pads 113 of the first pad part 110. For example, the device isolation line 102a may be disposed between the dam 104 and ends of the secondary pads 113 not to overlap the secondary pads 113, and in this case, as a distance between the dam 104 and the outer surface OS of the first substrate 100 increases, a second distance D2 between a center portion of the outermost pixel Po and the outer surface OS of the first substrate 100 may not be implemented to be half or less of the first interval (or the pixel pitch) D1. Accordingly, at least a portion of the device isolation line 102a may overlap the secondary pads 113 of the first pad part 110, and thus, the second distance D2 between the center portion of the outermost pixel Po and the outer surface OS of the first substrate 100 may be implemented to be half or less of the first interval (or the pixel pitch) D1.

Additionally, the passivation layer PAS disposed between the device isolation line 102a and the secondary pads 113 may be formed in an undercut structure with respect to ends of the secondary pads 113. For example, a lateral surface 102c of the passivation layer PAS disposed under the ends of the secondary pads 113 may be over-etched by a process of forming the first dam pattern 104a of the dam 104, and thus, may have the undercut structure with respect to ends of the secondary pads 113. Accordingly, the device isolation portion 102 may include a lower undercut area based on the undercut structure 102b disposed under the device isolation line 102a and an upper undercut area based on an undercut structure of the passivation layer PAS below the secondary pads 113 and the device isolation line 102a. Each of the lower undercut area and the upper undercut area of the device isolation portion 102 may be a structure for isolating (or disconnecting) each of the common electrode CE and the self-emitting device ED disposed over the device isolation portion 102.

According to an embodiment, as illustrated in FIG. 13, the device isolation line 102a disposed at the one periphery portion of the first substrate 100 and disposed between the first pads 111 may be disposed between the outer surface OS of the first substrate 100 and the dam 104 and may not overlap the first pads 111 and the secondary pads 113, and thus, may include the protrusion tip 102t having an caves structure with respect to the undercut structure 102b.

According to an embodiment, as illustrated in FIG. 14, the device isolation line 102a disposed at the other periphery portion, except the one periphery portion, of the first substrate 100 may be disposed between the outer surface OS of the first substrate 100 and the dam 104 and may not overlap the first pads 111 and the secondary pads 113, and thus, may include the protrusion tip 102t having an eaves structure with respect to the undercut structure 102b.

Referring to FIGS. 8, 10, and 12 to 14, a groove line 105 according to an embodiment of the present disclosure may be disposed or formed to have a closed loop line shape in the first margin area MA1 of the outermost pixel Po or the first substrate 100.

The groove line 105 according to an embodiment may correspond to a region from which all structures in a spread path, through which the encapsulation layer 106 spreads to the dam 104, has been removed. The groove line 105 may be a region from which all of a single-layer structure or a multi-layer structure, including at least one of the passivation layer PAS, the planarization layer 103, the pixel electrode material layer, and the bank BK disposed on the interlayer insulation layer ILD near an inner region of the dam 104, have been removed. For example, the groove line 105 may be formed or implemented by patterning (or removing) the passivation layer PAS and the planarization layer 103 disposed in the first margin area MA1 of the outermost pixel Po or the first substrate 100. Accordingly, the groove line 105 may define a lateral surface 103s of the planarization layer 103 and may have a closed loop line shape surrounding the lateral surface 103s of the planarization layer 103.

According to an embodiment, the groove line 105 may be formed by patterning (or removing) the interlayer insulation layer ILD, the passivation layer PAS, and the planarization layer 103 over the buffer layer 101a, and thus, an uppermost surface (or a surface) of the buffer layer 101a may be exposed. For example, the groove line 105 may include a primary groove line, which is formed over the buffer layer 101a by a patterning process of patterning the interlayer insulation layer ILD for forming a source/drain contact hole of a TFT, and a secondary groove line which is formed over the buffer layer 101a by a patterning process of patterning the planarization layer 103 and the passivation layer PAS for forming an electrode contact hole ECH of the TFT. The buffer layer 101a may be exposed between a lateral end 103e of the planarization layer 103 and the dam 104 by the groove line 105, and thus, a bottom surface of the groove line 105 may be implemented by an upper surface of the buffer layer 101a. For example, the groove line 105 may have a width which is wider than or equal to the dam 104.

One side of the groove line 105 may define the lateral surface 103s of the planarization layer 103, a lateral surface PASs of the passivation layer PAS, and a lateral surface ILDs of the interlayer insulation layer ILD disposed over the first substrate 100 or in the display area AA. For example, each of the lateral surface 103s of the planarization layer 103, the lateral surface PASs of the passivation layer PAS, and the lateral surface ILDs of the interlayer insulation layer ILD may be exposed to implement one sidewall of the groove line 105.

According to an embodiment, the lateral end 103e of the planarization layer 103 may protrude from the lateral surface PASs of the passivation layer PAS to a center portion (or the dam 104) of the groove line 105. For example, a distance between the lateral end 103e of the planarization layer 103 and the dam 104 may be less than a distance between the lateral surface PASs of the passivation layer PAS and the dam 104. A distance between the lateral end 103e of the planarization layer 103 and the lateral surface PASs of the passivation layer PAS may be greater than a thickness obtained by summating a thickness of the self-emitting device ED and a thickness of the common electrode CE. Therefore, a periphery portion of the planarization layer 103 including the lateral surface 103s and the lateral end 103e of the planarization layer 103 may cover each of the lateral surface PASs of the passivation layer PAS and the lateral surface ILDs of the interlayer insulation layer ILD and may directly face an upper surface of the buffer layer 101a. Accordingly, the periphery portion of the planarization layer 103 may have an caves structure with respect to the lateral surface PASs of the passivation layer PAS.

According to an embodiment, each of the lateral surface PASs of the passivation layer PAS and the lateral surface ILDs of the interlayer insulation layer ILD may be implemented in an inclined structure or a forward tapered structure. Therefore, each of the lateral surface PASs of the passivation layer PAS and the lateral surface ILDs of the interlayer insulation layer ILD may have an undercut structure with respect to the periphery portion of the planarization layer 103. For example, a lateral upper portion of the passivation layer PAS or a boundary portion between the passivation layer PAS and the planarization layer 103 disposed at one side of the groove line 105 may have an undercut structure. Based on the undercut structure, an undercut area UCA may be implemented between the lateral surface PASs of the passivation layer PAS and the planarization layer 103, and the undercut area UCA may be a structure for isolating (or disconnecting) the common electrode CE and the self-emitting device ED disposed on the groove line 105 and the periphery portion of the planarization layer 103. For example, the undercut area UCA may be formed or implemented by an over-etching process performed on each of the passivation layer PAS and the interlayer insulation layer ILD.

Each of the dam 104, the device isolation portion 102, and the groove line 105 according to an embodiment of the present disclosure may be formed or implemented after a process of forming the bank BK and before a process of forming the self-emitting device ED and may isolate (or disconnect) the self-emitting device ED in a process of forming (or depositing) the self-emitting device ED.

According to an embodiment, a material layer of the self-emitting device ED disposed over the groove line 105 and the periphery portion of the planarization layer 103 may be automatically isolated (or disconnected) in performing a deposition process, based on the undercut area UCA (or an caves structure) between the lateral end 103e of the planarization layer 103 and the lateral surface PASs of the passivation layer PAS. For example, a deposition material of the self-emitting device ED may have linearity, and thus, may not be deposited over the lateral surface PASs of the passivation layer PAS covered (or occluded) by the lateral end 103e of the planarization layer 103 and may be deposited over the lateral end 103e of the planarization layer 103 and the buffer layer 101a over the groove line 105, whereby the deposition material of the self-emitting device ED may be isolated (or disconnected) at the undercut area UCA between the lateral end 103e of the planarization layer 103 and the lateral surface PASs of the passivation layer PAS. Accordingly, the self-emitting device ED may be automatically isolated (or disconnected) at the groove line 105 in performing the deposition process.

According to an embodiment, a material layer of the self-emitting device ED disposed over the dam 104 may be automatically isolated (or disconnected) in performing the deposition process, based on an undercut area UCA (or an eaves structure) between the first dam pattern 104a and the second dam pattern 104b. For example, the deposition material of the self-emitting device ED may have linearity, and thus, may not be deposited over a lateral surface of the first dam pattern 104a covered (or occluded) by the second dam pattern 104b and may be deposited over an upper surface and a lateral surface of the dam 104 and the buffer layer 101a near the dam 104, whereby the deposition material of the self-emitting device ED may be isolated (or disconnected) in the undercut area UCA between the first dam pattern 104a and the second dam pattern 104b. Accordingly, the self-emitting device ED may be automatically isolated (or disconnected) at the dam 104 in performing the deposition process.

According to an embodiment, the material layer of the self-emitting device ED disposed over the device isolation portion 102 may be automatically isolated (or disconnected) in performing the deposition process, based on the protrusion tip 102t of the device isolation line 102a. For example, the deposition material of the self-emitting device ED may have linearity, and thus, may not be deposited over a lateral surface of the undercut structure 102b covered (or occluded) by the protrusion tip 102t of the device isolation line 102a and may be deposited over an upper surface and a lateral surface of the protrusion tip 102t of the device isolation line 102a and the buffer layer 1011a under the protrusion tip 102t of the device isolation line 102a, whereby the deposition material of the self-emitting device ED may be isolated (or disconnected) at an undercut area between the protrusion tip 102t of the device isolation line 102a and the undercut structure 102b. Accordingly, the self-emitting device ED may be automatically isolated (or disconnected) at the protrusion tip 102t of the device isolation line 102a of the device isolation portion 102 in performing the deposition process.

According to an embodiment, the self-emitting device ED disposed at a periphery portion of the outermost pixel Po or the first substrate 100 may be isolated (or disconnected) at least three times by each of device isolation portion 102, the dam 104, and the groove line 105, and an isolation pattern EDi of the self-emitting device ED may be formed in an island shape at an upper surface of the buffer layer 101a over the groove line 105 and may be formed in an island shape at an upper surface of the buffer layer 101a between the dam 104 and the device isolation portion 102.

According to an embodiment, the self-emitting device ED disposed at the periphery portion of the outermost pixel Po or the first substrate 100 may be automatically isolated (or disconnected) by each of the device isolation portion 102, the dam 104, and the groove line 105 in performing a deposition process, and thus, a separate patterning process for isolating (or disconnecting) the self-emitting device ED disposed at the periphery portion of the first substrate 100 may be omitted for preventing the lateral penetration of water.

According to an embodiment, a lateral water penetration path of the first substrate 100 may be blocked by an undercut area of each of the device isolation portion 102, the dam 104, and the groove line 105. Particularly, the self-emitting device ED disposed at the periphery portion of the outermost pixel Po or the first substrate 100 may be isolated by the device isolation portion 102, and thus, may maximally reduce a distance between the dam 104 and the outer surface OS of the first substrate 100. Accordingly, the light emitting display apparatus according to an embodiment of the present disclosure may prevent a reduction in reliability of the self-emitting device ED caused by the lateral penetration of water and may have an air bezel structure which does not include a bezel area or has a zeroized bezel.

According to an embodiment, like the self-emitting device ED, the common electrode CE disposed on the self-emitting device ED may be isolated by the undercut area of each of the device isolation portion 102, the dam 104, and the groove line 105. In this case, the electrode material of the common electrode CE may be weaker in linearity than the material layer of the self-emitting device ED, and thus, may penetrate into the undercut area of each of the device isolation portion 102, the dam 104, and the groove line 105 to surround an end (or an isolation surface) of the self-emitting device ED isolated by the undercut area of each of the device isolation portion 102, the dam 104, and the groove line 105. For example, the electrode material of the common electrode CE may penetrate into an undercut area UCA between the lateral end 103c of the planarization layer 103 and the lateral surface PASs of the passivation layer PAS and may be deposited on a bottom surface of the lateral end 103e of the planarization layer 103, thereby surrounding the end (or the isolation surface) of the isolated self-emitting device ED. Also, the electrode material of the common electrode CE disposed on the dam 104 may penetrate into an undercut area UCA between the first dam pattern 104a and the second dam pattern 104b and may be deposited on a bottom surface of the second dam pattern 104b, thereby surrounding the end (or the isolation surface) of the isolated self-emitting device ED. Also, the electrode material of the common electrode CE disposed on the device isolation portion 102 may penetrate into an undercut area UCA between the protrusion tip 102t of the device isolation line 102a and the undercut structure 102b and may be deposited on a bottom surface of the protrusion tip 102t of the device isolation line 102a, thereby surrounding the end (or the isolation surface) of the isolated self-emitting device ED.

According to an embodiment, an isolation pattern CEi of the common electrode CE isolated in an island shape by each of the device isolation portion 102, the dam 104, and the groove line 105 may directly contact an uppermost surface (or a surface) of the buffer layer 101a to surround the isolation pattern EDi of the self-emitting device ED isolated in an island shape by each of the device isolation portion 102, the dam 104, and the groove line 105. For example, the isolation pattern CEi of the common electrode CE may directly contact the uppermost surface (or the surface) of the buffer layer 101a, between the device isolation portion 102 and the dam 104 and in each groove line 105 and may seal a boundary portion between each isolation pattern EDi of the self-emitting device ED and the buffer layer 101a, thereby preventing or blocking the lateral penetration of water through the boundary portion between each isolation pattern EDi of the self-emitting device ED and the buffer layer 101a.

According to an embodiment, the light emitting device layer EDL, the device isolation portion 102, the dam 104, and the groove line 105 may be surrounded by the first encapsulation layer 106a of the encapsulation layer 106. For example, the first encapsulation layer 106a may be deposited by a certain thickness on the other whole portion, except the first pad part 110 of the first substrate 100, of the first substrate 100, and thus, may cover the light emitting device layer EDL disposed over the planarization layer 103 and may cover the isolation pattern CEi of the common electrode CE disposed in each of the device isolation portion 102, the dam 104, and the groove line 105. Particularly, the first encapsulation layer 106a may deeply penetrate into the undercut area of each of the device isolation portion 102, the dam 104, and the groove line 105 and may surround up to the undercut area of each of the device isolation portion 102, the dam 104, and the groove line 105.

According to an embodiment, the second encapsulation layer 106b (or an organic encapsulation layer) disposed on the first encapsulation layer 106a may be disposed at an encapsulation region of the display area AA defined by the dam 104. The second encapsulation layer 106b may spread toward the groove line 105 surrounding the lateral surface 103s of the planarization layer 103 and may wholly surround the light emitting device layer EDL disposed over the upper surface and the lateral surface of the planarization layer 103. The spread of the second encapsulation layer 106b may smoothly travel up to the dam 104 through the groove line 105, and thus, the second encapsulation layer 106b may be completely filled up to a region adjacent to an inner portion of the dam 104. Also, the spread of the second encapsulation layer 106b may be finally blocked by the second to fourth dam patterns 104b to 104d of the dam 104, and thus, the dam 104 may block or prevent the overflow of the second encapsulation layer 106b. Accordingly, the dam 104 according to an embodiment of the present disclosure may include a function of physically isolating the light emitting device layer, a function of preventing the spread or overflow of the organic encapsulation layer 106b, and a function of preventing the penetration of water in the lateral direction of the substrate 100.

According to an embodiment, the third encapsulation layer 106c disposed over the second encapsulation layer 106b may be implemented to surround all of the second encapsulation layer 106b disposed in the inner portion of the dam 104, the second encapsulation layer 106b disposed in the outer portion of the dam 104, and the first encapsulation layer 106a.

According to an embodiment, at least some of the secondary pads 113 disposed at the first pad part 110 may be exposed at the first substrate 100. For example, at least some of the secondary pads 113 may be implemented by a pad open process performed after a process of forming the third encapsulation layer 106c. Accordingly, the secondary pads 113 exposed at the first substrate 100 may be electrically coupled to the routing line 410 of the routing portion 400.

According to an embodiment, a periphery portion of each of the self-emitting device ED, the common electrode CE, the first encapsulation layer 106a, and the third encapsulation layer 106c disposed over the device isolation portion 102 may be removed by the pad open process. Accordingly, the encapsulation layer 106 may be disposed over the other portion, except a portion between the outer surface OS of the first substrate 100 and the device isolation portion 102, of the first substrate 100 and may cover the light emitting device layer EDL and the dam 104.

For example, the periphery portion of each of the self-emitting device ED, the common electrode CE, the first encapsulation layer 106a, and the third encapsulation layer 106c disposed over the device isolation portion 102 may be removed by the pad open process. At this time, an end 106ac of the first encapsulation layer 106a may be disposed under a protrusion tip 102t of the device isolation portion 102 and may directly contact the buffer layer 101a. Also, the isolated pattern CEi of the common electrode CE directly deposited over a bottom surface of the protrusion tip 102t of the device isolation portion 102 may not be removed by the pad open process and may be maintained with being deposited on the bottom surface of the protrusion tip 102t of the device isolation portion 102, and moreover, may be spaced apart from the isolated pattern CEi of the common electrode CE disposed under the protrusion tip 102t of the device isolation portion 102. Accordingly, the isolated pattern Cei and EDi of each of the common electrode CE and the self-emitting device ED which are isolated by the device isolation portion 102 and are disposed in an island shape on the buffer layer 101a under the device isolation portion 102 may be maintained with being surrounded by the first encapsulation layer 106a. Also, an end 106e of the third capsulation layer 106c disposed at the device isolation portion 102 may be maintained with physically contacting the first encapsulation layer 106a disposed at the device isolation portion 102.

As described above, in the light emitting display apparatus according to an embodiment of the present disclosure, the dam 104 disposed at the periphery portion of the first substrate 100 (or the outermost pixel) may include a function of isolating the self-emitting device ED, a function of blocking the spread or overflow of the organic encapsulation layer, and a function of preventing the penetration of water, thereby preventing a reduction in reliability of the self-emitting device ED caused by the lateral penetration of water (or moisture). Also, in the light emitting display apparatus according to an embodiment of the present disclosure, as the self-emitting device ED disposed at the periphery portion of the first substrate 100 or the outermost pixel Po is isolated by the device isolation portion 102, a distance between the dam 104 and the outer surface OS of the first substrate 100 may decrease, and as the device isolation portion 102 and the dam 104 are disposed at the periphery portions of the outermost pixels, the light emitting display apparatus may prevent a reduction in reliability of the self-emitting device ED caused by the lateral penetration of water and may have an air bezel structure which does not include a bezel area or has a zeroized bezel. Also, in the light emitting display apparatus according to an embodiment of the present disclosure, the spread of the second encapsulation layer 106b may smoothly travel up to the dam 104 through a groove line 105 disposed between the end of the planarization layer 103 and the dam 104, and thus, a non-filling phenomenon of the second encapsulation layer 106b occurring in a region adjacent to the inner portion of the dam 104 may be prevented or minimized.

Figure 15:
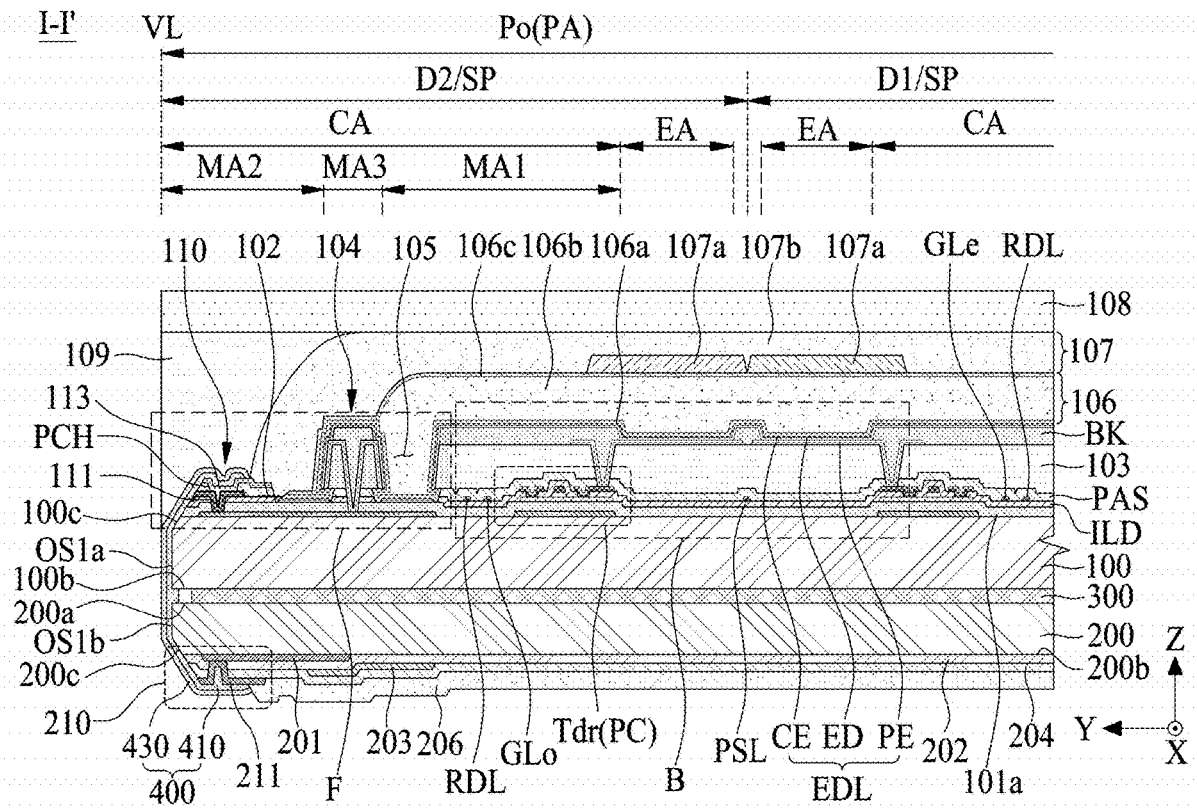
FIG. 15 is another cross-sectional view taken along line I-I' illustrated in FIG. 7.
Figure 16:
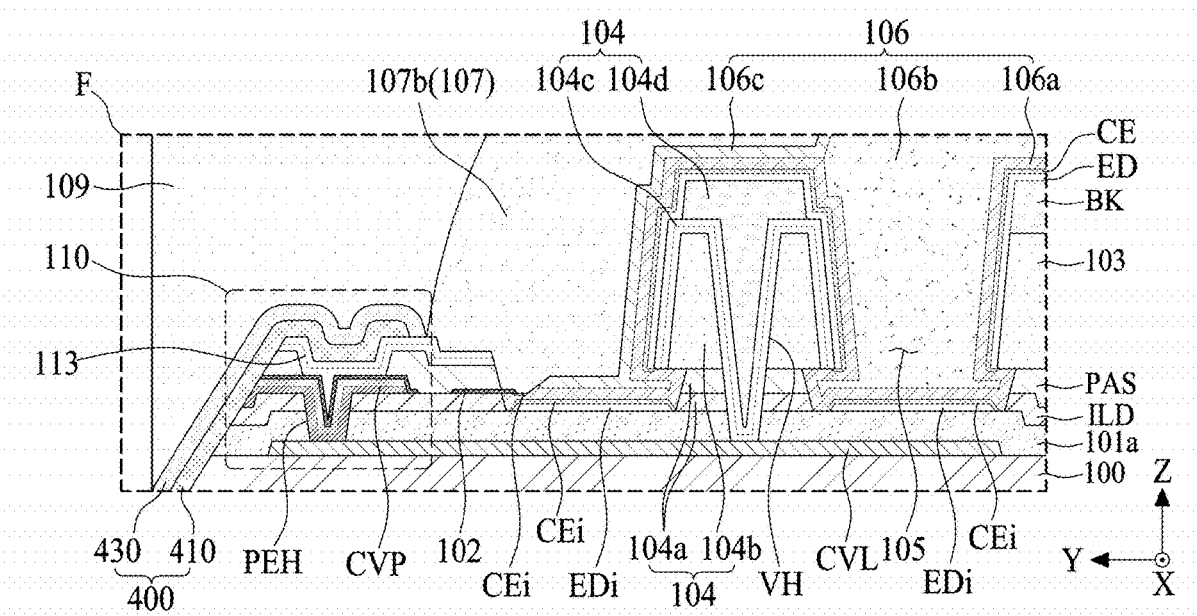
FIG. 16 is an enlarged view of a region 'F' illustrated in FIG. 15.

FIG. 15 is another cross-sectional view taken along line I-I' illustrated in FIG. 7, and FIG. 16 is an enlarged view of a region F illustrated in FIG. 15. The drawings illustrate an embodiment implemented by modifying the structure of the dam described above with reference to FIGS. 7 to 14. Hereinafter, therefore, their repetitive descriptions of elements other than a dam and elements relevant thereto are omitted or will be briefly given.

Referring to FIGS. 7, 15, and 16, a dam 104 according to another embodiment of the present disclosure may include a first dam pattern 104a, a second dam pattern 104b, a third dam pattern 104c, and a fourth dam pattern 104d.

The first dam pattern 104a may be implemented by an interlayer insulation layer ILD and a passivation layer PAS. This is as described above, and thus, its repetitive description is omitted.

The second dam pattern 104b may be disposed over the first dam pattern 104a. This is as described above, and thus, its repetitive description is omitted.

The third dam pattern 104c may be disposed over the second dam pattern 104b so as to be electrically coupled to at least one pixel common voltage line CVL.

The third dam pattern 104c may include a metal material. The third dam pattern 104c according to an embodiment may include a metal layer having an at least two-layer structure which is the same as a pixel electrode PE. The third dam pattern 104c may surround an upper surface and a lateral surface of the second dam pattern 104b and may be electrically coupled to the at least one pixel common voltage line CVL through a via hole VH formed at the second dam pattern 104b, the first dam pattern 104a, and the circuit later such as a buffer layer 101a. For example, the via hole VH may be formed to sequentially pass through the second dam pattern 104b, the first dam pattern 104a, and the buffer layer 101a disposed at an overlapping portion between the pixel common voltage line CVL and the third dam pattern 104c having a closed loop line shape. Therefore, the third dam pattern 104c may be electrically coupled to the at least one pixel common voltage line CVL through the via hole VH. Accordingly, the third dam pattern 104c may form an equivalent potential along with a plurality of pixel common voltage lines CVL and may primarily block static electricity flowing from the outside to an inner portion of a display area AA to prevent a defect caused by static electricity. For example, the third dam pattern 104c may discharge static electricity, flowing in from the outside, to the pixel common voltage line CVL to prevent a defect caused by static electricity.

The fourth dam pattern 104d may be stacked on the third dam pattern 104c. The fourth dam pattern 104d may have a width which is less than or equal to a top surface of the third dam pattern 104c. A lateral surface of the fourth dam pattern 104d may be implemented in an inclined structure or a forward tapered structure. For example, the fourth dam pattern 104d cut in a widthwise direction may have a cross-sectional structure having a trapezoid shape which is the same as the second dam pattern 104b.

The fourth dam pattern 104d according to an embodiment may include an organic insulating material or an inorganic insulating material. For example, the fourth dam pattern 104d may be stacked on the third dam pattern 104c and may include the same material as a bank BK. The fourth dam pattern 104d may be formed or implemented by a portion (or a non-patterning region) of the bank BK which remains on the third dam pattern 104c without being patterned (or removed) by a patterning process performed on the bank BK.

As described above, the light emitting display apparatus including the dam 104 according to another embodiment of the present disclosure may have the same effect as the light emitting display apparatus illustrated in FIGS. 7 to 14, and the third dam pattern 104c of the dam 104 having a closed loop line shape may be electrically coupled to the pixel common voltage lines CVL, thereby preventing or minimizing a defect caused by static electricity flowing in from the outside.

Figure 17:
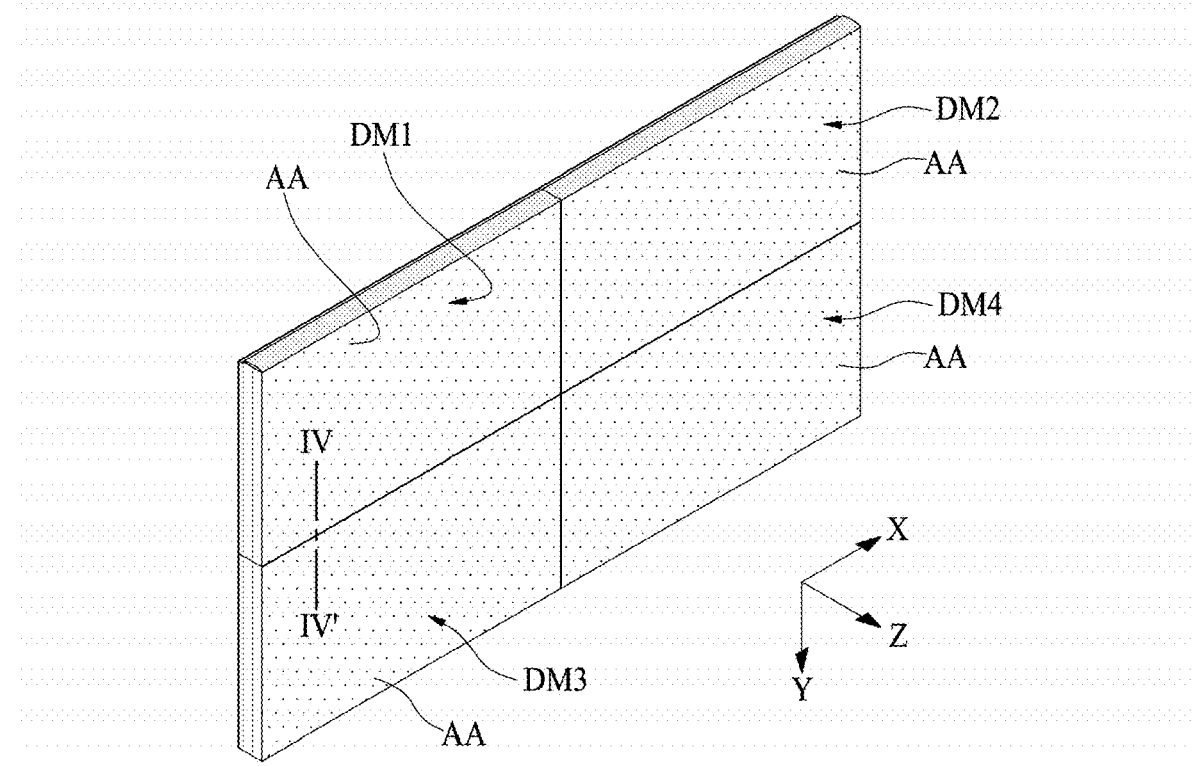
FIG. 17 is a diagram illustrating a multi-screen display apparatus according to an embodiment of the present disclosure.
Figure 18:
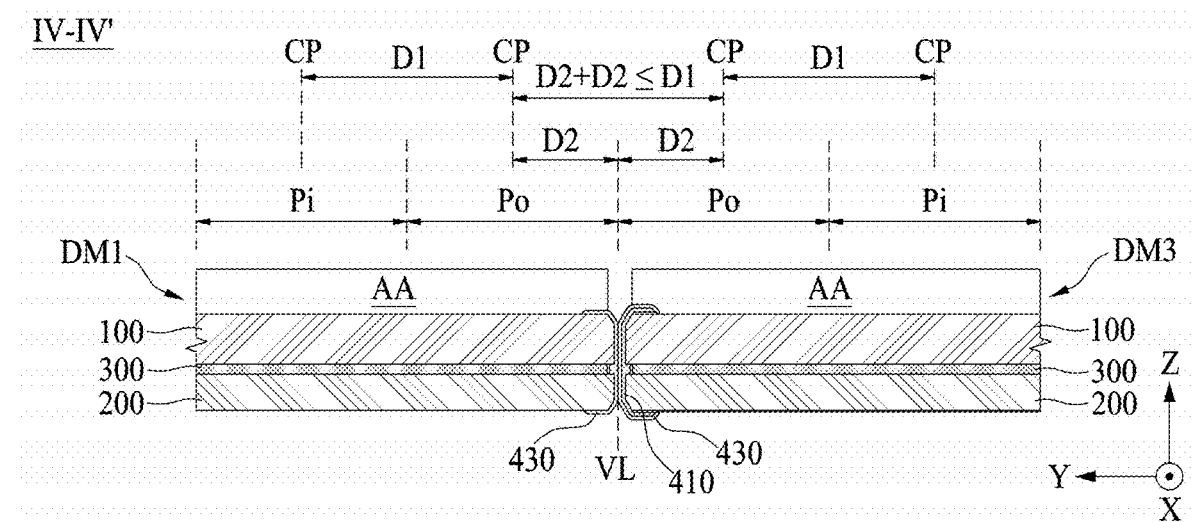
FIG. 18 is a cross-sectional view taken along line IV-IV' illustrated in FIG. 17.

FIG. 17 is a diagram illustrating a multi-screen display apparatus according to an embodiment of the present disclosure, and FIG. 18 is a cross-sectional view taken along line IV-IV' illustrated in FIG. 17. FIGS. 17 and 18 illustrate a multi-screen display apparatus implemented by tiling the light emitting display apparatus according to another embodiment of the present disclosure illustrated in FIGS. 1 to 16.

Referring to FIGS. 17 and 18, the multi-screen display apparatus (or a tiling light emitting display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 1 to 16, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to an embodiment of the present disclosure, in each of the plurality of display devices DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 18, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed in each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 17 and 18, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, in the x×1 form, x may be a natural number greater than or equal to 2, in the 1×y form, y may be a natural number greater than or equal to 2, and in the x×y form, x and y may be natural numbers greater than or equal to 2 and may be equal to or different from each other. For example, in the x×y form, x may be a natural number greater than or equal to 2 and may be equal to y, or x and y may be natural numbers greater than or equal to 2 with y greater or less than x.

As described above, when display area AA of each of the plurality of display devices DM1 to DM4 is one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A light emitting display apparatus and multi-screen display apparatus including the same according to an embodiment of the present disclosure will be described below.

A light emitting display apparatus according to an embodiment of the present disclosure may comprise a substrate including a display area, a circuit layer disposed in the display area, a planarization layer disposed over the circuit layer, a dam disposed over the circuit layer along a periphery portion of the substrate, a device isolation portion disposed in the circuit layer and including a device isolation line surrounding the dam, and a light emitting device layer including a self-emitting device disposed over the planarization layer, the dam, and the device isolation portion, the device isolation line may comprise a protrusion tip protruding from the circuit layer to the dam, and the self-emitting device may be isolated by the protrusion tip of the device isolation line at the device isolation portion.

According to some embodiments of the present disclosure, the circuit layer may comprise a buffer layer disposed over the substrate, an interlayer insulation layer disposed over the buffer layer, and a passivation layer disposed over the interlayer insulation layer, the device isolation line may be disposed between the interlayer insulation layer and the passivation layer, and the protrusion tip of the device isolation line may protrude from a lateral surface of the interlayer insulation layer to the dam.

According to some embodiments of the present disclosure, the circuit layer may comprise an insulation layer disposed between the substrate and the device isolation line, the device isolation portion may further comprise an undercut structure formed in the insulation layer under the device isolation line, and the protrusion tip of the device isolation line has an eaves structure with respect to the undercut structure.

According to some embodiments of the present disclosure, the device isolation line may comprise a transparent conductive metal material.

According to some embodiments of the present disclosure, the light emitting display apparatus may further comprise a pad part disposed at one periphery portion of the substrate, the pad part may comprise a pad disposed on the same layer as the device isolation line, and the device isolation line disposed at the one periphery portion of the substrate may be spaced apart and electrically separated from the pad.

According to some embodiments of the present disclosure, the circuit layer may comprise a buffer layer disposed over the substrate, an interlayer insulation layer disposed over the buffer layer, and a passivation layer disposed over the interlayer insulation layer, the pad may comprise a pad electrode layer disposed over the interlayer insulation layer, and a pad cover layer surrounding the pad electrode layer, and each of the pad cover layer and the device isolation line may comprise a transparent conductive metal material.

According to some embodiments of the present disclosure, the pad part may further comprise a secondary pad disposed over the circuit layer and electrically coupled to the pad, and at least a portion of the device isolation line disposed at the one periphery portion of the substrate may overlap the secondary pad.

According to some embodiments of the present disclosure, the self-emitting device may be additionally isolated by the dam.

According to some embodiments of the present disclosure, the dam may comprise a first dam pattern implemented at the circuit layer, a second dam pattern disposed on the first dam pattern, a third dam pattern disposed on the second dam pattern, a fourth dam pattern disposed on the third dam pattern, and an undercut area formed between the first dam pattern and the second dam pattern, and the self-emitting device disposed over the dam may be isolated by the undercut area.

According to some embodiments of the present disclosure, the first dam pattern may comprise an inorganic insulating material, the second dam pattern may comprise an organic insulating material, the third dam pattern may comprise a metal material, and the fourth dam pattern may comprise an organic insulating material or an inorganic insulating material.

According to some embodiments of the present disclosure, the light emitting display apparatus may further comprise a pixel common voltage line disposed in the display area, the light emitting device layer may further comprise a common electrode disposed over the self-emitting device and electrically coupled to the pixel common voltage line, and the third dam pattern may comprise a metal material and may be electrically coupled to the pixel common voltage line through a via hole formed at the second dam pattern, the first dam pattern, and the circuit layer.

According to some embodiments of the present disclosure, the light emitting display apparatus may further comprise a groove line disposed between a lateral surface of the planarization layer and the dam and surrounded by the dam, and an undercut area between the lateral surface of the planarization layer and the circuit layer, the self-emitting device may be additionally isolated at the undercut area.

According to some embodiments of the present disclosure, the circuit layer may comprise a buffer layer disposed over the substrate, an interlayer insulation layer disposed over the buffer layer, and a passivation layer disposed over the interlayer insulation layer, the groove line is formed by removing all of the interlayer insulation layer, the passivation layer, and the planarization layer disposed over the buffer layer, and an upper surface of the buffer layer may be a bottom surface of the groove line.

According to some embodiments of the present disclosure, the light emitting display apparatus may further comprise an encapsulation layer covering the dam and the light emitting device layer disposed over a portion, other than a portion between an outer surface of the substrate and the device isolation portion, of the substrate.

According to some embodiments of the present disclosure, the encapsulation layer may comprise a first encapsulation layer covering the dam and the light emitting device layer disposed over the portion, other than the portion between the outer surface of the substrate and the device isolation portion, of the substrate, a second encapsulation layer disposed on the first encapsulation layer of an encapsulation region defined by the dam, and a third encapsulation layer covering the first encapsulation layer disposed outside the dam and the second encapsulation layer.

According to some embodiments of the present disclosure, an end of the first encapsulation layer may be disposed under a protrusion tip of the device isolation line.

According to some embodiments of the present disclosure, the light emitting display apparatus may further comprise a first pad part may be configured to include a plurality of first pads disposed at one periphery portion of the substrate, a wiring substrate is configured to include a second pad part including a plurality of second pads overlapping each of the plurality of first pads, a coupling member disposed between the substrate and the wiring substrate, and a routing portion disposed at one lateral surface of each of the substrate and the line substrate and including a plurality of routing lines to connect the plurality of first pads to the plurality of second pads in a one-to-one relationship.

According to some embodiments of the present disclosure, the display area may be configured to include a plurality of pixels arranged over the substrate along a first direction and a second direction transverse to the first direction, a distance between a center portion of an outermost pixels of the plurality of pixels and an outer surface of the substrate may be half or less of a pixel pitch, and the pixel pitch may be a distance between center portions of two adjacent pixels to each other.

A multi-screen display apparatus according to some embodiments of the present disclosure may comprise a plurality of display devices disposed along at least one direction of a first direction and a second direction transverse to the first direction, each of the plurality of display devices may comprise a light emitting display apparatus, and the light emitting display apparatus may comprise a substrate including a display area, a circuit layer disposed in the display area, a planarization layer disposed over the circuit layer, a dam disposed over the circuit layer along a periphery portion of the substrate, a device isolation portion disposed in the circuit layer and including a device isolation line surrounding the dam, and a light emitting device layer including a self-emitting device disposed over the planarization layer, the dam, and the device isolation portion, the device isolation line may comprise a protrusion tip protruding from the circuit layer to the dam, and the self-emitting device may be isolated by the protrusion tip of the device isolation line at the device isolation portion.

According to some embodiments of the present disclosure, in the light emitting display apparatus of each of the plurality of display devices, the display area may be configured to include a plurality of pixels arranged over the substrate along the first direction and the second direction, in a first display device and a second display device adjacent along at least one direction of the first direction and the second direction, a distance between a center portion of an outermost pixel of the first display device and a center portion of an outermost pixel of the second display device may be less than or equal to a pixel pitch, and the pixel pitch may be a distance between center portions of two adjacent pixels to each other.

The light emitting display apparatus according to an embodiment of the present disclosure may be applied to all electronic devices including a display panel. For example, the light emitting display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:
a substrate including a display area;
a circuit layer disposed in the display area;
a planarization layer disposed over the circuit layer;
a dam disposed over the circuit layer along a periphery portion of the substrate;
a groove line disposed between a lateral surface of the planarization layer and the dam and surrounded by the dam;
an undercut area between the lateral surface of the planarization layer and the circuit layer; and
a light emitting device layer including a self-emitting device disposed over the planarization layer, the dam, and the groove line,
wherein the self-emitting device is disconnected at the undercut area and the dam.

2. The light emitting display apparatus of claim 1, wherein the dam comprises either a metal material or a transparent conductive metal material.

3. The light emitting display apparatus of claim 1, wherein the dam comprises:
a first dam pattern implemented at the circuit layer;
a second dam pattern disposed on the first dam pattern;
a third dam pattern disposed on the second dam pattern;
a fourth dam pattern disposed on the third dam pattern; and
a second undercut area formed between the first dam pattern and the second dam pattern,
wherein the self-emitting device disposed over the dam is disconnected by the second undercut area.

4. The light emitting display apparatus of claim 3, wherein:
the first dam pattern includes an inorganic insulating material,
the second dam pattern includes an organic insulating material,
the third dam pattern includes a metal material, and
the fourth dam pattern includes either an organic insulating material or an inorganic insulating material.

5. The light emitting display apparatus of claim 3, further comprising a pixel common voltage line disposed in the display area,
wherein the light emitting device layer further includes a common electrode disposed over the self-emitting device and electrically coupled to the pixel common voltage line, and
wherein the third dam pattern includes a metal material and is electrically coupled to the pixel common voltage line through a via hole formed at the second dam pattern, the first dam pattern, and the circuit layer.

6. The light emitting display apparatus of claim 1, wherein the circuit layer includes:
a buffer layer disposed over the substrate;
an interlayer insulation layer disposed over the buffer layer; and
a passivation layer disposed over the interlayer insulation layer,
wherein the groove line is formed by removing all of the interlayer insulation layer, the passivation layer, and the planarization layer disposed over the buffer layer, and
wherein an upper surface of the buffer layer is a bottom surface of the groove line.

7. The light emitting display apparatus of claim 1, further comprising an encapsulation layer covering the dam and the light emitting device layer.

8. The light emitting display apparatus of claim 1, further comprising a device isolation line disposed in the circuit layer to have a closed loop line shape surrounding the dam,
wherein the self-emitting device in an outer region of the dam is disconnected at the device isolation line.

9. The light emitting display apparatus of claim 8, wherein the device isolation line includes a protrusion tip protruding from the circuit layer to the dam, and
wherein the self-emitting device in an outer region of the dam is disconnected by the protrusion tip of the device isolation line.

10. The light emitting display apparatus of claim 9, wherein the circuit layer includes:
a buffer layer disposed over the substrate;
an interlayer insulation layer disposed over the buffer layer; and a passivation layer disposed over the interlayer insulation layer, wherein the device isolation line is disposed between the interlayer insulation layer and the passivation layer, and wherein the protrusion tip of the device isolation line protrudes from a lateral surface of the interlayer insulation layer to the dam.

11. The light emitting display apparatus of claim 9, further comprising an undercut structure under the device isolation line, wherein the circuit layer includes an insulation layer disposed between the substrate and the device isolation line, wherein the undercut structure is formed in the insulation layer under the device isolation line, and wherein the protrusion tip of the device isolation line has an eaves structure with respect to the undercut structure.

12. The light emitting display apparatus of claim 9, further comprising a pad part disposed at one periphery portion of the substrate, wherein the pad part includes a pad disposed on the same layer as the device isolation line, and wherein the device isolation line disposed at the one periphery portion of the substrate is spaced apart and electrically separated from the pad.

13. The light emitting display apparatus of claim 12, wherein the circuit layer includes:

a buffer layer disposed over the substrate;

an interlayer insulation layer disposed over the buffer layer; and a passivation layer disposed over the interlayer insulation layer, wherein the pad includes:

a pad electrode layer disposed over the interlayer insulation layer; and a pad cover layer surrounding the pad electrode layer, and wherein each of the pad cover layer and the device isolation line includes a transparent conductive metal material.

14. The light emitting display apparatus of claim 12, wherein the pad part further includes a secondary pad disposed over the circuit layer and electrically coupled to the pad, and wherein at least a portion of the device isolation line disposed at the one periphery portion of the substrate overlaps the secondary pad.

15. The light emitting display apparatus of claim 9, further comprising an encapsulation layer covering the dam and the light emitting device layer, wherein the encapsulation layer includes:

a first encapsulation layer covering the dam and the light emitting device layer disposed over the portion, other than the portion between the outer surface of the substrate and the device isolation line, of the substrate;

a second encapsulation layer disposed over the first encapsulation layer of an encapsulation region defined by the dam; and a third encapsulation layer covering the first encapsulation layer disposed outside the dam and the second encapsulation layer.

16. The light emitting display apparatus of claim 15, wherein an end of the first encapsulation layer is disposed under the protrusion tip of the device isolation line.

17. The light emitting display apparatus of claim 1, further comprising:

a first pad part including a plurality of first pads disposed at one periphery portion of the substrate;

a wiring substrate including a second pad part including a plurality of second pads overlapping each of the plurality of first pads;

a coupling member disposed between the substrate and the wiring substrate; and a routing portion disposed at one lateral surface of each of the substrate and the wiring substrate and including a plurality of routing lines to couple the plurality of first pads to the plurality of second pads in a one-to-one relationship.

18. The light emitting display apparatus of claim 1, wherein the display area includes a plurality of pixels arranged over the substrate along a first direction and a second direction transverse to the first direction, wherein a distance between a center portion of an outermost pixels of the plurality of pixels and an outer surface of the substrate is half or less of a pixel pitch, and wherein the pixel pitch is a distance between center portions of two adjacent pixels to each other.

19. A multi-screen display apparatus, comprising:

a plurality of display devices disposed along at least one direction of a first direction and a second direction transverse to the first direction, wherein each of the plurality of display devices includes a light emitting display apparatus, the light emitting display apparatus including:

a substrate including a display area;

a circuit layer disposed in the display area;

a planarization layer disposed over the circuit layer;

a dam disposed over the circuit layer along a periphery portion of the substrate;

a groove line disposed between a lateral surface of the planarization layer and the dam and surrounded by the dam;

an undercut area between the lateral surface of the planarization layer and the circuit layer; and a light emitting device layer including a self-emitting device disposed over the planarization layer, the dam, and the groove line, wherein the self-emitting device is disconnected at the undercut area and the dam.

20. The multi-screen display apparatus of claim 19, wherein in the light emitting display apparatus of each of the plurality of display devices, the display area includes a plurality of pixels arranged over the substrate along the first direction and the second direction, wherein in a first display device and a second display device adjacent along at least one direction of the first direction and the second direction, a distance between a center portion of an outermost pixel of the first display device and a center portion of an outermost pixel of the second display device is less than or equal to a pixel pitch, and wherein the pixel pitch is a distance between center portions of two adjacent pixels to each other.

* * * * *